(12) United States Patent
Antonyan

(10) Patent No.: US 9,892,773 B2
(45) Date of Patent: Feb. 13, 2018

(54) UNIT ARRAY OF A MEMORY DEVICE, MEMORY DEVICE, AND MEMORY SYSTEM INCLUDING THE SAME

(71) Applicant: Samsung Electronics Co., Ltd., Suwon-si (KR)

(72) Inventor: Artur Antonyan, Suwon-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 14/744,033

(22) Filed: Jun. 19, 2015

(65) Prior Publication Data

US 2016/0035402 A1 Feb. 4, 2016

(30) Foreign Application Priority Data

Aug. 4, 2014 (KR) .................. 10-2014-0099640

(51) Int. Cl.
  *G11C 11/16* (2006.01)
  *G11C 13/00* (2006.01)
(52) U.S. Cl.
  CPC ...... *G11C 11/1673* (2013.01); *G11C 11/1655* (2013.01); *G11C 13/004* (2013.01); *G11C 13/0026* (2013.01); *G11C 2013/0054* (2013.01)
(58) Field of Classification Search
  CPC ............ G11C 11/1673; G11C 11/1655; G11C 13/0026
  USPC .......................................................... 365/63
  See application file for complete search history.

(56) References Cited

U.S. PATENT DOCUMENTS

| 5,596,527 A | * | 1/1997 | Tomioka | G11C 11/5621 365/185.03 |
| 5,943,286 A | * | 8/1999 | Orita | G11C 7/14 365/185.16 |
| 6,269,040 B1 | * | 7/2001 | Reohr | G11C 7/06 365/190 |
| 6,385,111 B2 | * | 5/2002 | Tran | G11C 7/14 365/158 |
| 6,388,917 B2 | * | 5/2002 | Hoffmann | G11C 11/16 257/E27.005 |
| 6,507,517 B2 | * | 1/2003 | Rolandi | G11C 7/1072 365/185.11 |
| 7,023,726 B1 | * | 4/2006 | Chen | G11C 11/15 365/158 |
| 7,286,429 B1 | * | 10/2007 | Liaw | G11C 7/02 365/158 |
| 7,307,885 B2 | * | 12/2007 | Ikeda | G11C 7/14 365/185.03 |
| 7,453,719 B2 | | 11/2008 | Sakimura et al. | |
| 7,499,314 B2 | | 3/2009 | Yang et al. | |

(Continued)

*Primary Examiner* — Anthan Tran
*Assistant Examiner* — Mushfique Siddique
(74) *Attorney, Agent, or Firm* — Muir Patent Law, PLLC

(57) ABSTRACT

A memory device includes a memory array including a plurality of sections, each including a plurality of memory cells and at least one reference cell. The memory device may also include a plurality of sense amplifier circuits respectively corresponding to the plurality of sections, and a plurality of switch circuits, each switch circuit connected between a respective section and sense amplifier circuit. Each switch circuit may be configured to select between communicatively connecting a first column of memory cells or a reference cell to a corresponding sense amplifier.

19 Claims, 25 Drawing Sheets

(56) References Cited

U.S. PATENT DOCUMENTS

| | | | |
|---|---|---|---|
| 7,733,729 B2 | 6/2010 | Boeve | |
| 7,898,845 B2* | 3/2011 | Tsuchida | G11C 7/18 365/158 |
| 8,134,881 B2 | 3/2012 | Boeve | |
| 8,274,819 B2 | 9/2012 | Yang | |
| 8,281,221 B2* | 10/2012 | Sakimura | G06F 11/1044 714/753 |
| 8,526,215 B2 | 9/2013 | Chen et al. | |
| 8,587,994 B2 | 11/2013 | Kim et al. | |
| 8,665,638 B2 | 3/2014 | Rao et al. | |
| 9,576,652 B1* | 2/2017 | Lim | G11C 13/004 |
| 9,728,254 B2* | 8/2017 | Park | G11C 13/004 |
| 2003/0099125 A1* | 5/2003 | Kang | G11C 11/22 365/145 |
| 2003/0231525 A1* | 12/2003 | Mine | G11C 7/14 365/189.07 |
| 2004/0114430 A1* | 6/2004 | Anzai | G11C 11/5642 365/185.03 |
| 2005/0047234 A1* | 3/2005 | Kamata | G11C 16/28 365/205 |
| 2005/0057972 A1* | 3/2005 | Taito | G11C 16/3418 365/185.28 |
| 2005/0180212 A1* | 8/2005 | Kojima | G11C 16/04 365/185.11 |
| 2007/0109841 A1* | 5/2007 | Lin | G11C 7/062 365/158 |
| 2007/0195626 A1* | 8/2007 | Kim | G11C 7/14 365/189.15 |
| 2008/0037336 A1* | 2/2008 | Kouno | G11C 7/12 365/189.15 |
| 2008/0094884 A1 | 4/2008 | Yang et al. | |
| 2008/0285360 A1* | 11/2008 | Sakimura | G11C 7/02 365/189.15 |
| 2009/0129147 A1* | 5/2009 | Yano | G11C 16/28 365/185.2 |
| 2011/0188305 A1 | 8/2011 | Yang | |
| 2011/0194333 A1* | 8/2011 | Kim | G11C 29/808 365/158 |
| 2011/0199848 A1* | 8/2011 | Carman | G11C 7/02 365/205 |
| 2012/0250400 A1* | 10/2012 | Katayama | G11C 11/1673 365/158 |
| 2013/0265820 A1 | 10/2013 | Chih et al. | |
| 2013/0272060 A1 | 10/2013 | Andre et al. | |
| 2014/0281279 A1* | 9/2014 | Oh | G06F 3/0655 711/147 |
| 2014/0359249 A1* | 12/2014 | Kho | G06F 12/0646 711/173 |
| 2015/0170730 A1* | 6/2015 | Antonyan | G11C 11/4099 365/189.07 |
| 2015/0262622 A1* | 9/2015 | Iizuka | G11C 5/06 365/63 |
| 2015/0332760 A1* | 11/2015 | Kim | G11C 11/1655 711/125 |
| 2016/0343421 A1* | 11/2016 | Pyo | G11C 11/1673 |
| 2017/0162248 A1* | 6/2017 | Matsuoka | G11C 11/1655 |
| 2017/0236594 A1* | 8/2017 | Yang | G11C 16/28 365/185.21 |

\* cited by examiner

PRIOR ART

FIG. 20

| ACCESS ADDRESS | REFERENCE REGION 1 | REFERENCE REGION 2 | REFERENCE REGION 3 |
|---|---|---|---|
| SECTION 1 | NOT ENABLE | ENABLE | ENABLE |
| SECTION 2 | ENABLE | NOT ENABLE | ENABLE |
| SECTION 3 | ENABLE | ENABLE | NOT ENABLE |

FIG. 21

| ACCESS ADDRESS | EN |
|---|---|
| SECTION 1 (A1 ~ A10) | 011 |
| SECTION 2 (A11 ~ A21) | 101 |
| SECTION 3 (A22 ~ A32) | 110 |

FIG. 22

| ACCESS ADDRESS | EN |
|---|---|
| SECTION 1 (A1 ~ A21) | 011 |
| SECTION 2 (A22 ~ A42) | 101 |
| SECTION 3 (A43 ~ A64) | 110 |

FIG. 23

| ACCESS ADDRESS | EN |
|---|---|
| SECTION 1 (A1 ~ A42) | 011 |
| SECTION 2 (A43 ~ A85) | 101 |
| SECTION 3 (A86 ~ A128) | 110 |

UNIT ARRAY OF A MEMORY DEVICE, MEMORY DEVICE, AND MEMORY SYSTEM INCLUDING THE SAME

CROSS-REFERENCE TO RELATED APPLICATION

This application claims priority under 35 USC § 119 to Korean Patent Application No. 10-2014-0099640, filed on Aug. 4, 2014 in the Korean Intellectual Property Office (KIPO), the contents of which are herein incorporated by reference in their entirety.

BACKGROUND

1. Technical Field

The present disclosure relates generally to a semiconductor device and more particularly to a unit array of a memory device, a memory device, and a memory system including the unit array.

2. Description of the Related Art

In case one bit data is read from a memory cell array, the one bit data may be '0' or '1'. To determine whether the one bit data that is read from the memory cell array is '0', the first reference bit corresponding to data '0' may be used. In addition, to determine whether the one bit data that is read from the memory cell array is '1', the second reference bit corresponding to data '1' may be used. The one bit data, the first reference bit and the second reference bit may be stored in the memory cell array. The read speeds of the one bit data, the first reference bit and the second reference bit from the memory cell array may be different.

SUMMARY

In certain embodiments, a memory device includes a unit array of memory cells; a first memory cell region of the unit array including a first set of columns of memory cells, each column connected to a respective bit line; a first reference cell region of the unit array including at least a first reference cell; a first line selectively connected through a plurality of first switches to the first set of columns of memory cells and to the first reference cell; a second memory cell region of the unit array including a second set of columns of memory cells, each column connected to a respective bit line; a second reference cell region of the unit array including at least a second reference cell; a second line selectively connected through a plurality of second switches to the second set of columns of memory cells and to the second reference cell; a third memory cell region of the unit array including a third set of columns of memory cells, each column connected to a respective bit line; a third reference cell region of the unit array including at least a third reference cell; and a third line selectively connected through a plurality of third switches to the third set of columns of memory cells and to the third reference cell. The unit array may include $2^n$ columns of memory cells and a plurality of reference cells, n being an integer greater than. The memory device may additionally include a sense amplifier electrically connected to the first line, the second line, and the third line, wherein the sense amplifier is configured to provide read data based on an output from the first line, the second line, and the third line.

According to other embodiments, a memory device includes a memory array including a plurality of sections, each including a plurality of memory cells and at least one reference cell. The memory device may also include a plurality of sense amplifier circuits respectively corresponding to the plurality of sections, and a plurality of switch circuits, each switch circuit connected between a respective section and sense amplifier circuit. Each switch circuit may be configured to select between communicatively connecting a first column of memory cells or a reference cell to a corresponding sense amplifier.

In a further embodiment, a memory device includes a memory cell array including unit arrays each configured to provide selected data corresponding to an access address, and configured to use a first reference cell storing a first bit having a first logic value and a second reference cell storing a second bit having a second logic value different from the first logic value. The first reference cell and second reference cell may be selected based on the access address. A sense amplifier may be configured to provide read data based on the selected data, the first reference bit, and the second reference bit. In addition, the unit array may include a first section including a first data region and a first reference region, the first reference region including the first reference cell storing the first bit; a second section including a second data region and a second reference region, the second reference region including the second reference cell storing the second bit; and a third section including a third data region and a third reference region, the third reference region including a third reference cell storing a third bit having one of the first or second logic value. Each of the first section, the second section, and the third section may be configured to output selected data when the access address corresponds to that section.

BRIEF DESCRIPTION OF THE DRAWINGS

Illustrative, non-limiting example embodiments will be more clearly understood from the following detailed description taken in conjunction with the accompanying drawings.

FIG. 20 is a diagram for describing an operation of the memory device of FIG. 19, according to example embodiments.

FIG. 21 is a diagram illustrating an enable signal outputted from a reference region decoder in a case where a data column line number is 32, according to example embodiments.

FIG. 22 is a diagram illustrating an enable signal outputted from a reference region decoder in a case where a data column line number is 64, according to example embodiments.

FIG. 23 is a diagram illustrating an enable signal outputted from a reference region decoder in a case where a data column line number is 128, according to example embodiments.

DETAILED DESCRIPTION

Figure 1:
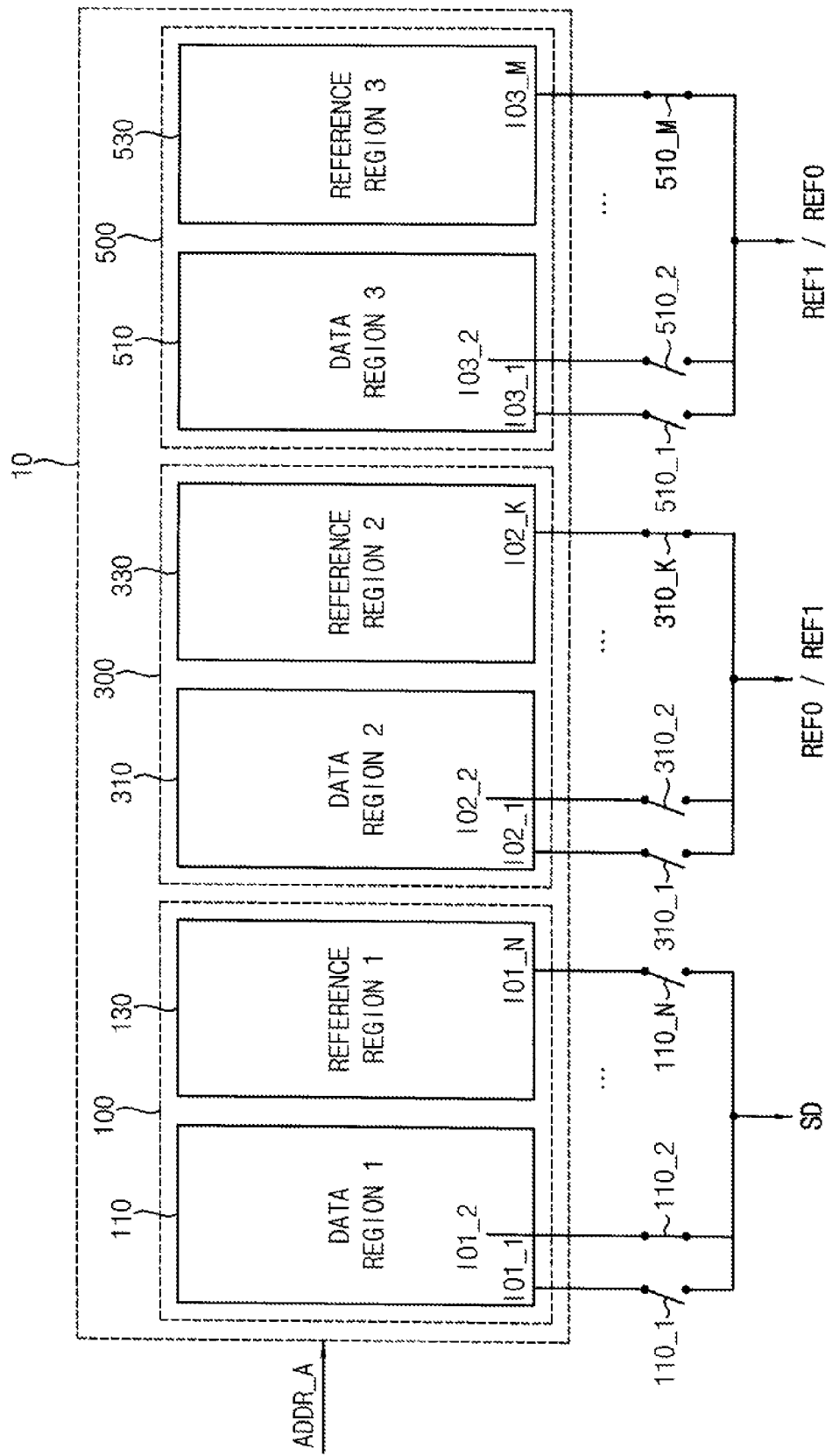
FIGS. 1 to 3 are diagrams illustrating a unit array of a memory device according to example embodiments.

Various example embodiments will be described more fully hereinafter with reference to the accompanying drawings, in which some example embodiments are shown. The present inventive concept may, however, be embodied in many different forms and should not be construed as limited to the example embodiments set forth herein. In the drawings, the sizes and relative sizes of layers and regions may be exaggerated for clarity. Like numerals refer to like elements throughout.

It will be understood that, although the terms first, second, third etc. may be used herein to describe various elements, these elements should not be limited by these terms. Unless the context indicates otherwise, these terms are used to distinguish one element from another, for example as a naming convention. Thus, a first element discussed below in one section of the specification could be termed a second element in another section of the specification without departing from the teachings of the present inventive concept. In addition, in certain cases, even if a term is not described using "first," "second," etc., in the specification, it may still be referred to as "first" or "second" in a claim in order to distinguish different claimed elements from each other.

As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted in the blocks may occur out of the order noted in the flowcharts. For example, two blocks shown in succession may in fact be executed substantially concurrently or the blocks may sometimes be executed in the reverse order, depending upon the functionality/acts involved.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
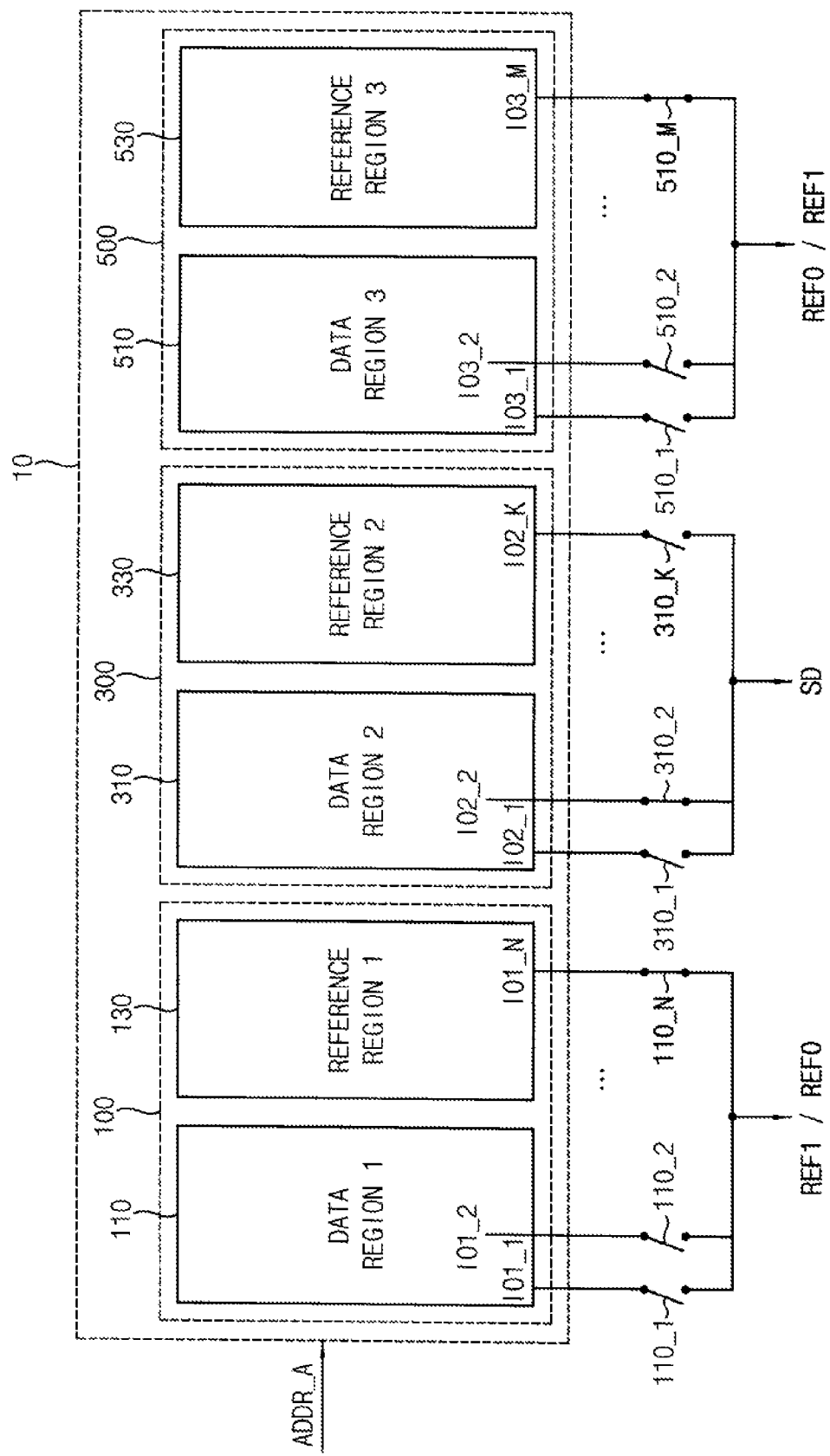
Figure 3:
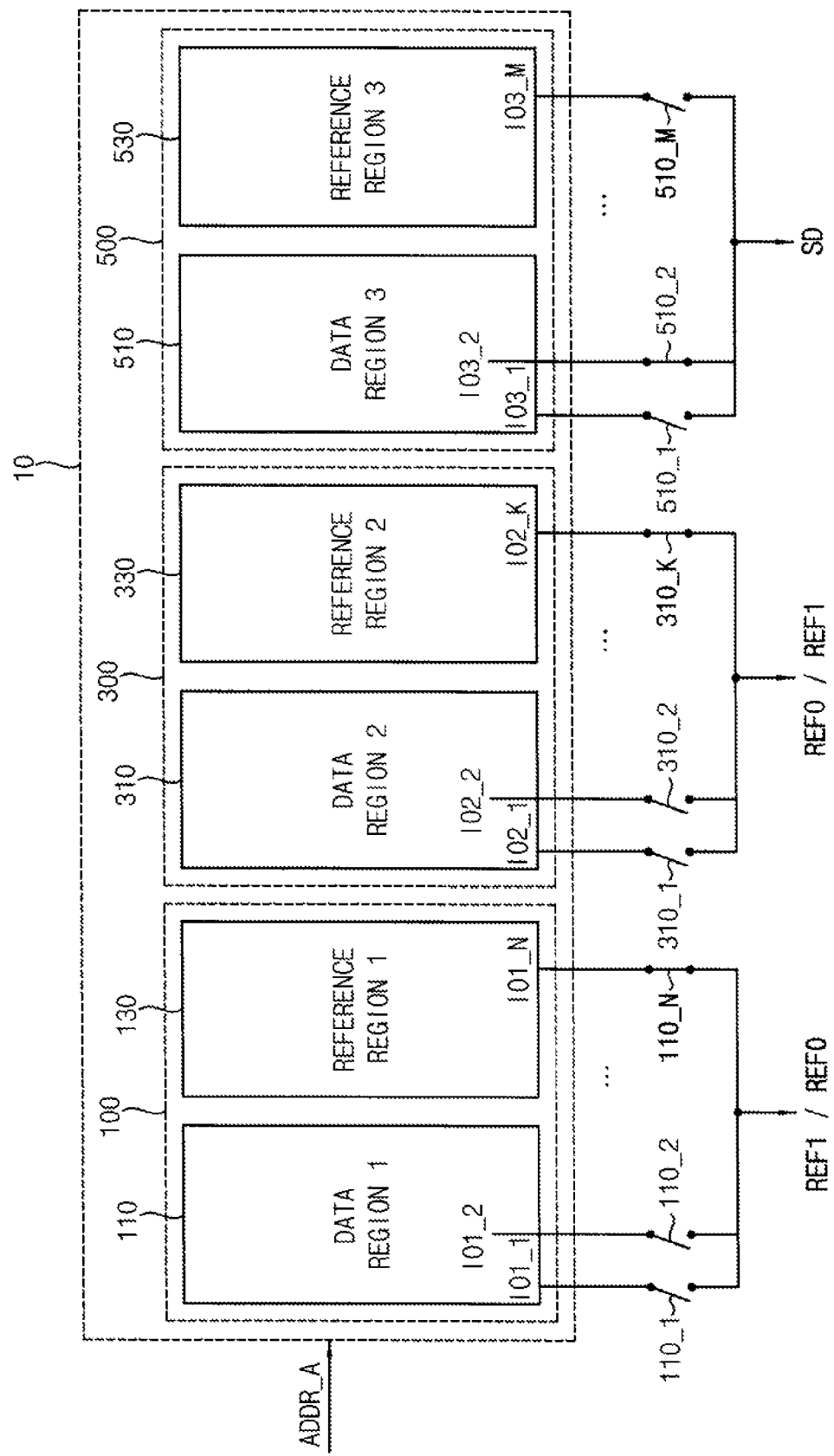

FIGS. 1 to 3 are diagrams illustrating a unit array of a memory device according to example embodiments.

Referring to FIGS. 1 to 3, a unit array 10 of a memory device may include an array of memory cells. As described herein, a "unit array" of memory cells may refer to an array of memory cells that includes $2^n$ memorycells, or that includes $2^n$ columns of memory cells. As shown in FIGS. 1-3, unit array 10 includes a first section 100, a second section 300 and a third section 500. The first section 100 includes a first data region 110 and a first reference region 130, also referred to herein as a first memory cell or data cell region 110 and a first reference cell region 130. The first reference region 130 stores at least a first reference bit having one of a first reference value REF0 and a second reference value REF1. Stated differently, the first reference region 130 includes at least a first reference cell storing a first bit having a first logic value REF0 (e.g., which may represent a logic "0") or a second logic value REF1 (e.g., which may represent a logic "1"). Data may be stored in the first data region 110, for example, in a memory cell that is part of a column of memory cells in the first memory cell region 110. For example, the first reference value REF0 may be used to determine whether the selection data SD is '0'. In addition, the second reference value REF1 may be used to determine whether the selection data SD is '1'. Examples of how a reference value or a reference bit of a reference cell can be used to determine the state of stored data can be seen, for example, in U.S. Pat. Nos. 8,665,638, 8,587,994, 7,733,729, and 6,388,917, and in U.S. Patent Application Publication Nos. 2011/0188305, and 2008/0094884, all of which are incorporated herein by reference in their entirety. In an example embodiment, the first reference region 130 may store only one reference bit that has the first reference value REF0. Alternatively, the first reference region 130 may store only one reference bit that has the second reference value REF1. As another example, the first reference region 130 may store two reference bits—a first having the first reference value REF0 and a second having the second reference value REF1.

As one example, a data region corresponding to the access address ADDR_A may be the first data region 110 included in the first section 100. In a case where the selection data SD is provided from the first data region 110, the first reference value REF0 may be provided from a reference cell in the second reference region 330 included in the second section 300 and the second reference value REF1 may be provided from a reference cell in the third reference region 530 included in the third section 500. As another example, in a case where the selection data SD is provided from the first data region 110, the second reference value REF1 may be provided from a reference cell in the second reference region 330 included in the second section 300 and the first reference value REF0 may be provided from a reference cell in the third reference region 530 included in the third section 500.

The unit array 10 of a memory device depicted in FIGS. 1-3 includes a first section 100, a second section 300 and a third section 500. In a case where the selection data SD is provided from the first section 100, the first reference value REF0 and the second reference value REF1 may be provided from the second section 300 and the third section 500, respectively. If column line numbers corresponding to each of the first section 100, the second section 300 and the third section 500 are same, capacitances corresponding to each of the first section 100, the second section 300 and the third section 500 are same. As will be described further in connection with FIG. 8, the capacitance 110_C corresponding to the first section 100 may reflect parasitic capacitance included in the first section 100 and input-output lines that are connected to the first section 100. The capacitance 310_C corresponding to the second section 300 may reflect parasitic capacitance included in the second section 300 and input-output lines that are connected to the second section 300. The capacitance 510_C corresponding to the third section 500 may reflect parasitic capacitance included in the third section 500 and input-output lines that are connected to the third section 500. If deviation of capacitance corresponding to each of the first section 100, the second section 300 and the third section 500 is decreased, the speed of outputting the selection data SD, the first reference bit REF0 and the second reference bit REF1 based on the access address ADDR_A may be increased.

The second section 300 includes a second data region 310 and a second reference region 330. The second reference region 330 stores at least one reference bit that has one of the first reference value REF0 and the second reference value REF1. Data may be stored in the second data region 310. In an example embodiment, the second reference region 330 may store only one reference bit that has the first reference value REF0. Alternatively, the second reference region 330 may store only one reference bit that has the second reference value REF1. In addition, the second reference region 330 may store two reference bits, one having the first reference value REF0 and another having the second reference value REF1.

As one example, the data region corresponding to the access address ADDR_A may be the second data region 310 included in the second section 300. In a case where the selection data SD is provided from the second data region 310, the first reference value REF0 may be provided from a reference cell in the first reference region 130 included in the first section 100, and the second reference value REF1 may be provided from a reference cell in the third reference region 530 included in the third section 500. As another example, in a case where the selection data SD is provided from the second data region 310, the second reference value REF1 may be provided from a reference cell in the first reference region 130 included in the first section 100 and the first reference value REF0 may be provided from a reference cell in the third reference region 530 included in the third section 500.

In a case where the selection data SD is provided from the second data region 310, the first reference value REF0 and the second reference value REF1 may be provided from the first section 100 and the third section 500, respectively. If column line numbers corresponding to each of the first section 100, the second section 300 and the third section 500 are same, capacitances corresponding to each of the first section 100, the second section 300 and the third section 500 are same. If the capacitances corresponding to each of the first section 100, the second section 300 and the third section 500 are same, the speed of outputting the selection data SD provided from the second section 300, the first reference bit REF0 and the second reference bit REF1 based on the access address ADDR_A may be equal.

The third section 500 includes a third data region 510 and a third reference region 530. The third reference region 530 stores at least one reference bit that has one of the first reference bit REF0 and the second reference bit REF1. The data may be stored in the third data region 510. In an example embodiment, the third reference region 530 may store only one reference bit that has the first reference value REF0. In addition, the third reference region 530 may store only one reference bit that has the second reference value REF1. In addition, the third reference region 530 may store two reference bits, one of which has the first reference value REF0, and the other of which has the second reference value REF1.

For example, data region corresponding to the access address ADDR_A may be the third data region 510 included in the third section 500. In a case where the selection data SD is provided from the third data region 510, the first reference value REF0 may be provided from a reference cell in the first reference region 130 included in the first section 100, and the second reference value REF1 may be provided from a reference cell in the second reference region 330 included in the second section 300. As one example, in a case where the selection data SD is provided from the third data region 510, the second reference value REF1 may be provided from the first reference region 130 included in the first section 100 and the first reference value REF0 may be provided from the second reference region 330 included in the second section 300.

In one example, in a case where the selection data SD is provided from the third section 500, the first reference bit REF0 and the second reference bit REF1 may be provided from the first section 100 and the second section 300, respectively. If column line numbers corresponding to each of the first section 100, the second section 300 and the third section 500 are same, capacitances corresponding to each of the first section 100, the second section 300 and the third section 500 are same. If the capacitances corresponding to each of the first section 100, the second section 300 and the third section 500 are same, the speed of outputting the selection data SD provided from the second section 300, the first reference bit REF0, and the second reference bit REF1 based on the access address ADDR_A may be equal.

The first section 100, the second section 300 and the third section 500 output a selection data SD corresponding to an access address ADDR_A, the first reference value REF0, and the second reference value REF1, based on the access address ADDR_A. For example, in a case where a section corresponding to the access address ADDR_A is the first section 100, the selection data SD may be read from the first data region 110 included in the first section 100. The selection data SD may be a read data. The first reference value REF0 may be read from the second reference region 330 included in the second section 300 and the second reference value REF1 may be read from the third reference region 530 included in the third section 500. In the read operation of the memory device, the center value of the first reference value REF0 and the second reference value REF1 may be compared to the selection data SD. In case the selection data SD is greater than the center value of the first reference value REF0 and the second reference value REF1, the selection data SD may be a data '1'. In addition, in case the selection data SD is less than the center value of the first reference value REF0 and the second reference value REF1, the selection data SD may be a data '0'. Alternatively, in a case where a section corresponding to the access address ADDR_A is the second section 300, the selection data SD may be read from the second data region 310 included in the second section 300. The first reference value REF0 may be read from the first reference region 130 included in the first section 100 and the second reference value REF1 may be read from the third reference region 530 included in the third section 500. In another example, in a case where a section corresponding to the access address ADDR_A is the third section 500, the selection data SD may be read from the third data region 510 included in the third section 500. The first reference value REF0 may be read from the first reference region 130 included in the first section 100 and the second reference value REF1 may be read from the second reference region 330 included in the second section 300.

Therefore, as described in connection with FIGS. 1-3, certain embodiments provide a memory device that includes a unit array of memory cells. The unit array may include $2^n$ columns of memory cells and a plurality of reference cells, n being an integer greater than 1. A first memory cell region of the unit array may include a first set of columns of memory cells. Each column may be connected to a respective bit line. A first reference cell region of the unit array may include at least a first reference cell. A first line is selectively connected through a plurality of first switches that form a first switching circuit to the first set of columns of memory cells and to the first reference cell. A second memory cell region of the unit array may include a second set of columns of memory cells. Each column may be connected to a respective bit line. A second reference cell region of the unit array includes at least a second reference cell. A second line is selectively connected through a plurality of second switches that form a second switching circuit to the second set of columns of memory cells and to the second reference cell. A third memory cell region of the unit array includes a third set of columns of memory cells. Each column may be connected to a respective bit line. A third reference cell region of the unit array may include at least a third reference cell. A third line is selectively connected through a plurality of third switches that form a third switching circuit to the third set of columns of memory cells and to the third reference cell. The memory device may additionally include a sense amplifier electrically connected to the first line, the second line, and the third line, wherein the sense amplifier is configured to provide read data based on an output from the first line, the second line, and the third line. For example, the sense amplifier may be configured to provide read data based on an output on the first line from a column from the first set of columns of memory cells, an output on the second line from the second reference cell, and an output on the third line from the third reference cell. Also, the sense amplifier may be additionally configured to provide read data based on an output on the second line from a column from the second set of columns of memory cells, an output on the first line from the first reference cell, and an output on the third line from the third reference cell.

The memory device may have additional reference cells in one or more of the first, second, and third reference cell regions. Each of the additional references cells may also be selectively connected to one of the first line, the second line, and the third line. In one embodiment, the memory device is an MRAM device that includes MRAM memory cells.

Figure 4:
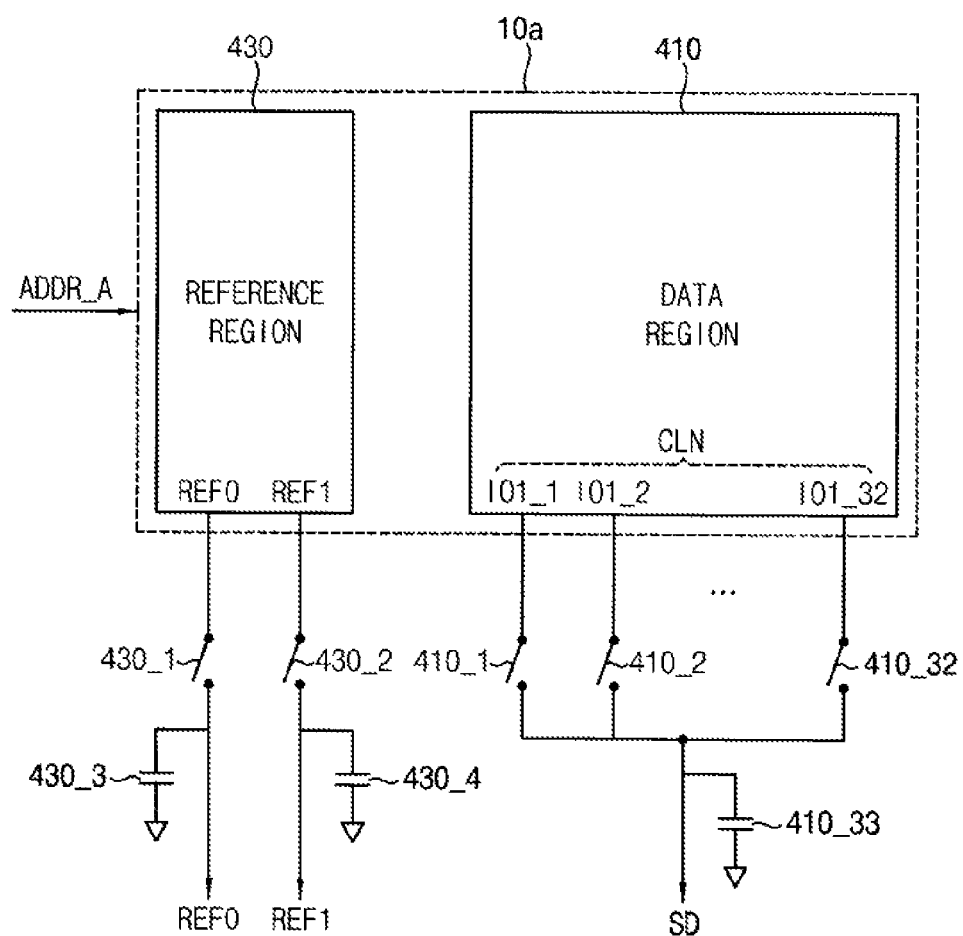
FIG. 4 is a diagram illustrating an example of a unit array of a memory device according to example embodiments.

FIG. 4 is a diagram illustrating an example of a unit array of a memory device, according to the prior art.

Referring to FIG. 4, a unit array 10a of a memory device according to one example of the prior art includes a data region 410 and a reference region 430. The data may be stored in the data region 410. The first reference value REF0 and the second reference value REF1 may be stored in first and second respective reference cells in the reference region 430. The first reference value REF0 may be used to determine whether the selection data SD is '0'. In addition, the second reference value REF1 may be used to determine whether the selection data SD is '1'. Examples of how a reference value or a reference bit of a reference cell can be used to determine the state of stored data can be seen, for example, in U.S. Pat. Nos. 8,665,638, 8,587,994, 7,733,729, and 6,388,917, and in U.S. Patent Application Publication Nos. 2011/0188305, and 2008/0094884, all of which are incorporated herein by reference in their entirety.

For example, the selection data SD may be provided through the second data input-output lines 410_1 to 410_32 based on the access address ADDR_A. In addition, the first reference value REF0 may be provided from the reference region 430 through the first reference input-output line 430_1. The second reference value REF1 may be provided from the reference region 430 through the second reference input-output line 430_2. The capacitance 430_33 corresponding to the data region 410 may reflect parasitic capacitance included in input-output lines that are connected to the data region 410. The capacitance 430_3 corresponding to the first reference input-output line 430_1 included in the reference region 430 may reflect parasitic capacitance included in the first reference input-output line 430_1. The capacitance 430_4 corresponding to the second reference input-output line 430_2 included in the reference region 430 may reflect parasitic capacitance included in the second reference input-output line 430_2. The parasitic capacitances of the input-output line corresponding to each of column lines included in the reference region 430 and the data region 410 may be equal. The capacitance of each input-output line may be C. The column line number included in the data region 410 may be 32. The capacitance 430_33 corresponding to the data region 410 may be 32C. The capacitance 430_3 corresponding to the first reference input-output line 430_1 included in the reference region 430 may be C. The capacitance 430_4 corresponding to the second reference input-output line 430_2 included in the reference region 430 may be C.

The capacitance 430_33 corresponding to the data region 410 may be greater than the capacitance 430_3 corresponding to the first reference input-output line 430_1 included in the reference region 430. In addition, the capacitance 430_33 corresponding to the data region 410 may be greater than the capacitance 430_4 corresponding to the second reference input-output line 430_2 included in the reference region 430. Therefore, in a case where the selection data SD, the first reference bit REF0, and the second reference bit REF1 are read from the unit array 10a based on the access address ADDR_A, the read speed of the first reference bit REF0 and the second reference bit REF1 may be faster than the read speed of the selection data SD. In case the read speed of the first reference bit REF0 and the second reference bit REF1 is faster than the read speed of the selection data SD, the read speed of the memory device may be determined by the read speed of the selection data SD.

Because of the speed difference between the read speed of the first reference bit REF0 and second reference bit REF1 and the read speed of the selection data SD, the read speed of the memory device may be decreased. If the first section 100, the second section 300 and the third section 500 are composed as depicted in FIGS. 1-3, for example, this may decrease the deviation of the capacitance corresponding to each of the first section 100, the second section 300 and the third section 500, and the speed difference between the read speed of the first reference bit REF0 and second reference bit REF1 and the read speed of the selection data SD may be decreased. In this case, the read speed of the first reference bit REF0 and second reference bit REF1 may be decreased. However, the read speed of the selection data SD may be increased. Therefore the read speed of the memory device may be increased.

Figure 5:
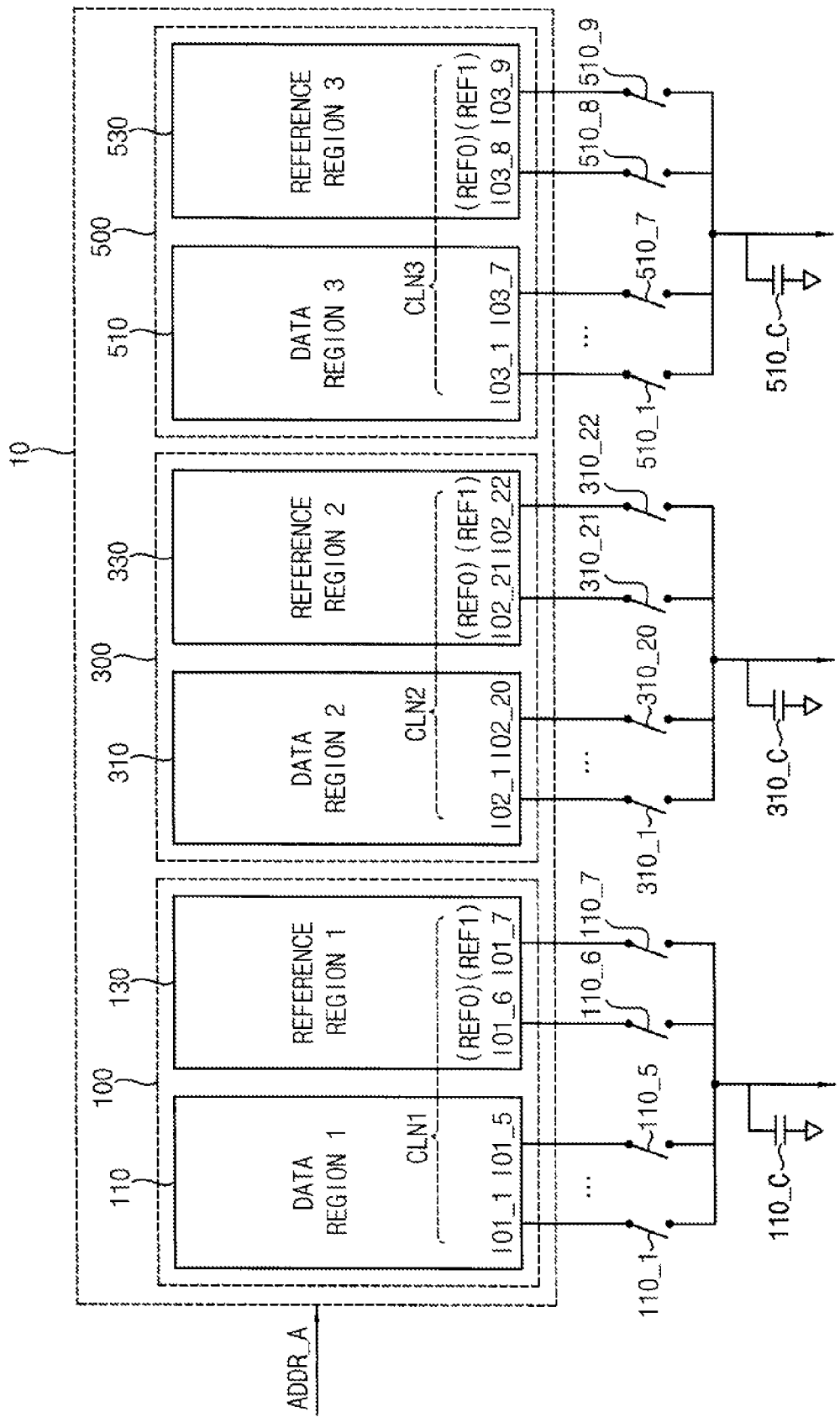
FIGS. 5 to 8 are diagrams illustrating a unit array of a memory device according to example embodiments in a case where a data column line number is 32.

FIG. 5 is diagram illustrating a unit array of a memory device according to example embodiments in case data column line number is 32 (e.g., in a case where a number of columns of memory cells in the memory cell region is 32).

Referring to FIG. 5, a unit array 10 of a memory device includes a first section 100, a second section 300 and a third section 500. The first section 100 includes a first data region 110 and a first reference region 130. The second section 300 includes a second data region 310 and a second reference region 330. The third section 500 includes a third data region 510 and a third reference region 530. The first section 100, the second section 300 and the third section 500 output a selection data SD corresponding to an access address ADDR_A, the first reference bit REF0, and the second reference bit REF1 based on the access address ADDR_A.

The data column line number may be a sum of a number of column lines included in the first data region 110, a number of column lines included in the second data region 310 and a number of column lines included in the third data region 510. For example, the number of column lines included in the first data region 110 may be 5. The number of column lines included in the second data region 310 may be 20. The number of column lines included in the third data region 510 may be 7. In this case, the number of column lines included in the first data region 110, the second data region 310 and the third data region 510 may be 32.

For example, the first reference bit REF0 (e.g., a logic '0') and the second reference bit REF1 (e.g., a logic '1') may be stored in the first reference region 130 included in the first section 100 and the number of column lines included in the first reference region 130 may be 2. The first reference bit REF0 and the second reference bit REF1 may be stored in the second reference region 330 included in the second section 300 and the number of column lines included in the second reference region 330 may be 2. The first reference bit REF0 and the second reference bit REF1 may be stored in the third reference region 530 included in the third section 500 and the number of column lines included in the third reference region 530 may be 2.

For example, the number CLN1 of column lines included in the first section 100 may be a sum of the number of column lines included in the first data region 110 and the number of column lines included in the first reference region 130. The number CLN1 of column lines included in the first section 100 may be 7. The number CLN2 of column lines included in the second section 300 may be a sum of the number of column lines included in the second data region 310 and the number of column lines included in the second reference region 330. The number CLN2 of column lines included in the second section 300 may be 22. The number CLN3 of column lines included in the third section 500 may be a sum of the number of column lines included in the third data region 510 and the number of column lines included in the third reference region 530. The number CLN3 of column lines included in the third section 500 may be 9.

The parasitic capacitances of the input-output line corresponding to each of column lines included in each section may be equal. The capacitance of each input-output line may be C. The capacitance 110_C corresponding to the first section 100 may be 7C, the capacitance 310_C corresponding to the second section 300 may be 22C and the capacitance 510_C corresponding to the third section 500 may be 9C.

As one example, the data region corresponding to the access address ADDR_A may be the first data region 110 included in the first section 100. In the case where the selection data SD is provided from the first data region 110, the first reference bit REF0 may be provided from the second reference region 330 included in the second section 300 and the second reference bit REF1 may be provided from the third reference region 530 included in the third section 500. In this case, because the capacitance 110_C corresponding to the first section 100 is the smallest among the capacitances corresponding to the first section 100, the second section 300 and the third section 500, the read speed of the selection data SD from the unit array 10 may be the fastest. Because the capacitance 510_C corresponding to the third section 500 is the second-smallest, the read speed of the second reference bit REF1 may be the second-fastest. Because the capacitance 510_C corresponding to the third section 500 is the greatest, the read speed of the first reference bit REF0 may be the slowest. In this case, the read speed of the memory device may be determined by the read speed of the first reference bit REF0.

Because of the speed difference between the read speed of the first reference bit REF0 and second reference bit REF1 and the read speed of the selection data SD, the read speed of the memory device may be decreased. If the first section 100, the second section 300 and the third section 500 are composed to decrease the deviation of the capacitance corresponding to each of the first section 100, the second section 300 and the third section 500, the speed difference between the read speed of the first reference bit REF0 and second reference bit REF1 and the read speed of the selection data SD may be decreased. In this case, the read speed of the selection data SD and the second reference bit REF1 may be decreased. However, the read speed of the first reference bit REF0 may be increased. Therefore the read speed of the memory device may be increased.

As one example, the data region corresponding to the access address ADDR_A may be the first data region 110 included in the first section 100. In case the selection data SD is provided from the first data region 110, the second reference bit REF1 may be provided from the second reference region 330 included in the second section 300 and the first reference bit REF0 may be provided from the third reference region 530 included in the third section 500. In this case, because the capacitance 110_C corresponding to the first section 100 is the smallest among the capacitances corresponding to the first section 100, the second section 300 and the third section 500, the read speed of the selection data SD from the unit array 10 may be the fastest. Because the capacitance 510_C corresponding to the third section 500 is the second-smallest, the read speed of the first reference bit REF0 may be the second-fastest. Because the capacitance 510_C corresponding to the third section 500 is the greatest, the read speed of the second reference bit REF1 may be the slowest. In this case, the read speed of the memory device may be determined by the read speed of the second reference bit REF1.

Because of the speed difference between the read speed of the first reference bit REF0 and second reference bit REF1 and the read speed of the selection data SD, the read speed of the memory device may be decreased. If the first section 100, the second section 300 and the third section 500 are composed to decrease the deviation of the capacitance corresponding to each of the first section 100, the second section 300 and the third section 500, the speed difference between the read speed of the first reference bit REF0 and second reference bit REF1 and the read speed of the selection data SD may be decreased. In this case, the read speed of the first reference bit REF0 and the selection data SD may be decreased. However, the read speed of the second reference bit REF1 may be increased. Therefore the read speed of the memory device may be increased.

In an example embodiment, a read speed of the selection data SD may be determined based on column line number difference among a first column line number CLN1, a second column line number CLN2, and a third column line number CLN3. The first column line number CLN1 may correspond to a number CLN1 of column lines included in the first section 100. The second column line number CLN2 may correspond to a number CLN2 of column lines included in the second section 300. The third column line number CLN3 may correspond to a number CLN3 of column lines included in the third section 500.

Figure 6:
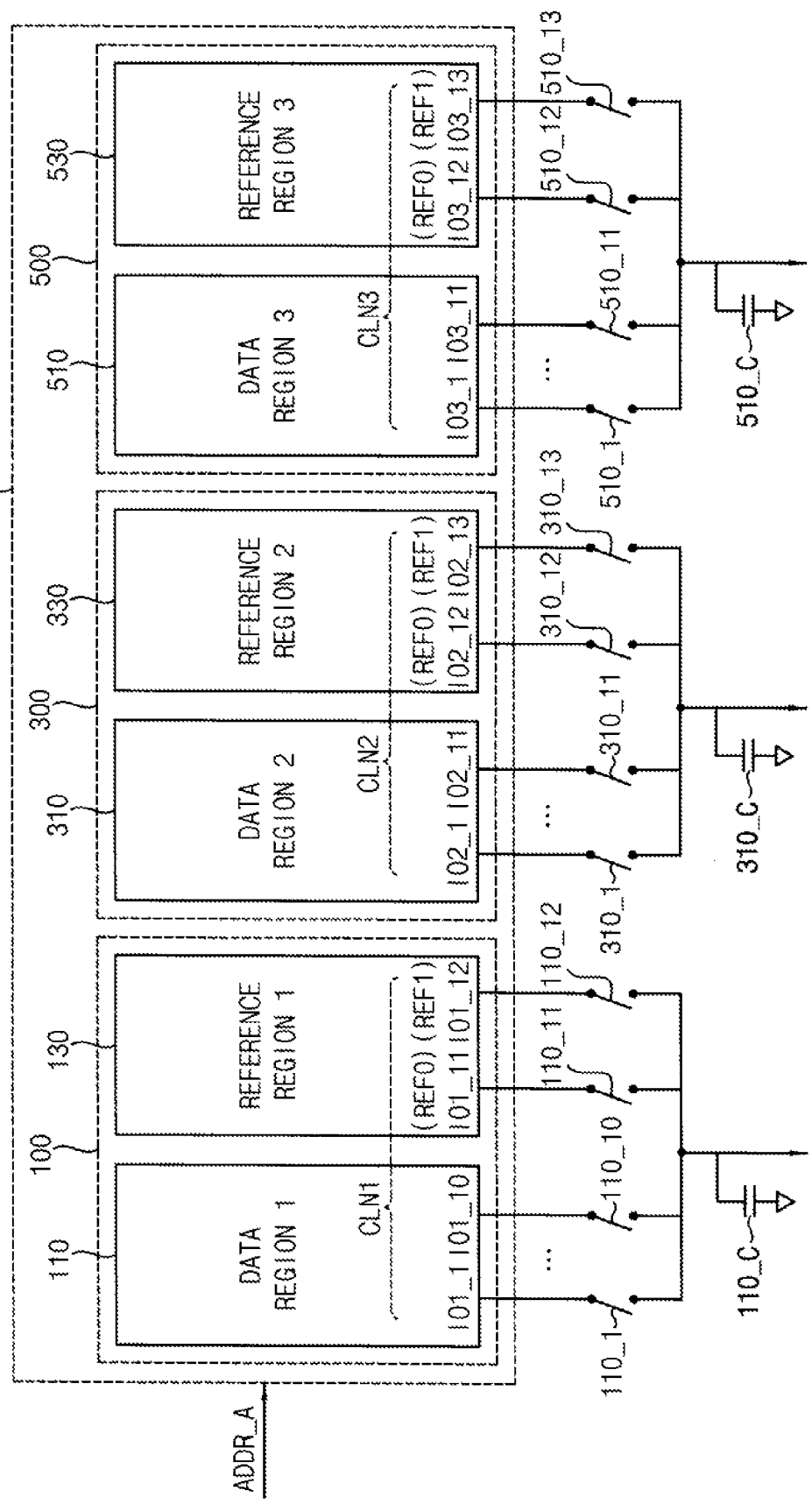

FIG. 6 is a diagram illustrating a unit array of a memory device according to an example embodiment in case data column line number is 32.

Referring to FIG. 6, a unit array 10 of a memory device includes a first section 100, a second section 300 and a third section 500. The first section 100 includes a first data region 110 and a first reference region 130. The second section 300 includes a second data region 310 and a second reference region 330. The third section 500 includes a third data region 510 and a third reference region 530. The first section 100, the second section 300 and the third section 500 output a selection data SD corresponding to an access address ADDR_A, the first reference bit REF0, and the second reference bit REF1 based on the access address ADDR_A.

For example, the number of column lines included in the first data region 110 may be 10. The number of column lines included in the second data region 310 may be 11. The number of column lines included in the third data region 510 may be 11. In this case, the number of column lines included in the first data region 110, the second data region 310 and the third data region 510 may be 32.

For example, the number of column lines included in the first reference region 130 may be 2, the number of column lines included in the second reference region 330 may be 2 and the number of column lines included in the third reference region 530 may be 2. For example, the number CLN1 of column lines included in the first section 100 may be 12. The number CLN2 of column lines included in the second section 300 may be 13. The number CLN3 of column lines included in the third section 500 may be 13.

The parasitic capacitances of the input-output line corresponding to each of column lines included in each section may be equal. The capacitance of each input-output line may be C. The capacitance 110_C corresponding to the first section 100 may be 12C, the capacitance 310_C corresponding to the second section 300 may be 13C and the capacitance 510_C corresponding to the third section 500 may be 13C.

For example, the data region corresponding to the access address ADDR_A may be the first data region 110 included in the first section 100. In case the selection data SD is provided from the first data region 110, the first reference bit REF0 may be provided from the second reference region 330 included in the second section 300 and the second reference bit REF1 may be provided from the third reference region 530 included in the third section 500. In this case, the capacitance corresponding to each section may be 12C or 13C. Comparing to the case of FIG. 5, the read speed of the selection data SD and the second reference bit REF1 may be decreased. However, the read speed of the first reference bit REF0 may be increased. If the first section 100, the second section 300 and the third section 500 are composed to decrease the deviation of the capacitance corresponding to each of the first section 100, the second section 300 and the third section 500, the speed difference between the read speed of the first reference bit REF0 and second reference bit REF1 and the read speed of the selection data SD may be decreased. Therefore the read speed of the memory device may be increased.

For example, the data region corresponding to the access address ADDR_A may be the first data region 110 included in the first section 100. In case the selection data SD is provided from the first data region 110, the second reference bit REF1 may be provided from the second reference region 330 included in the second section 300 and the first reference bit REF0 may be provided from the third reference region 530 included in the third section 500. In this case, comparing to the case of FIG. 5, the read speed of the first reference bit REF0 and the selection data SD may be decreased. However, the read speed of the second reference bit REF1 may be increased. If the first section 100, the second section 300 and the third section 500 are composed to decrease the deviation of the capacitance corresponding to each of the first section 100, the second section 300 and the third section 500, the speed difference between the read speed of the first reference bit REF0 and second reference bit REF1 and the read speed of the selection data SD may be decreased. Therefore the read speed of the memory device may be increased.

Figure 7:
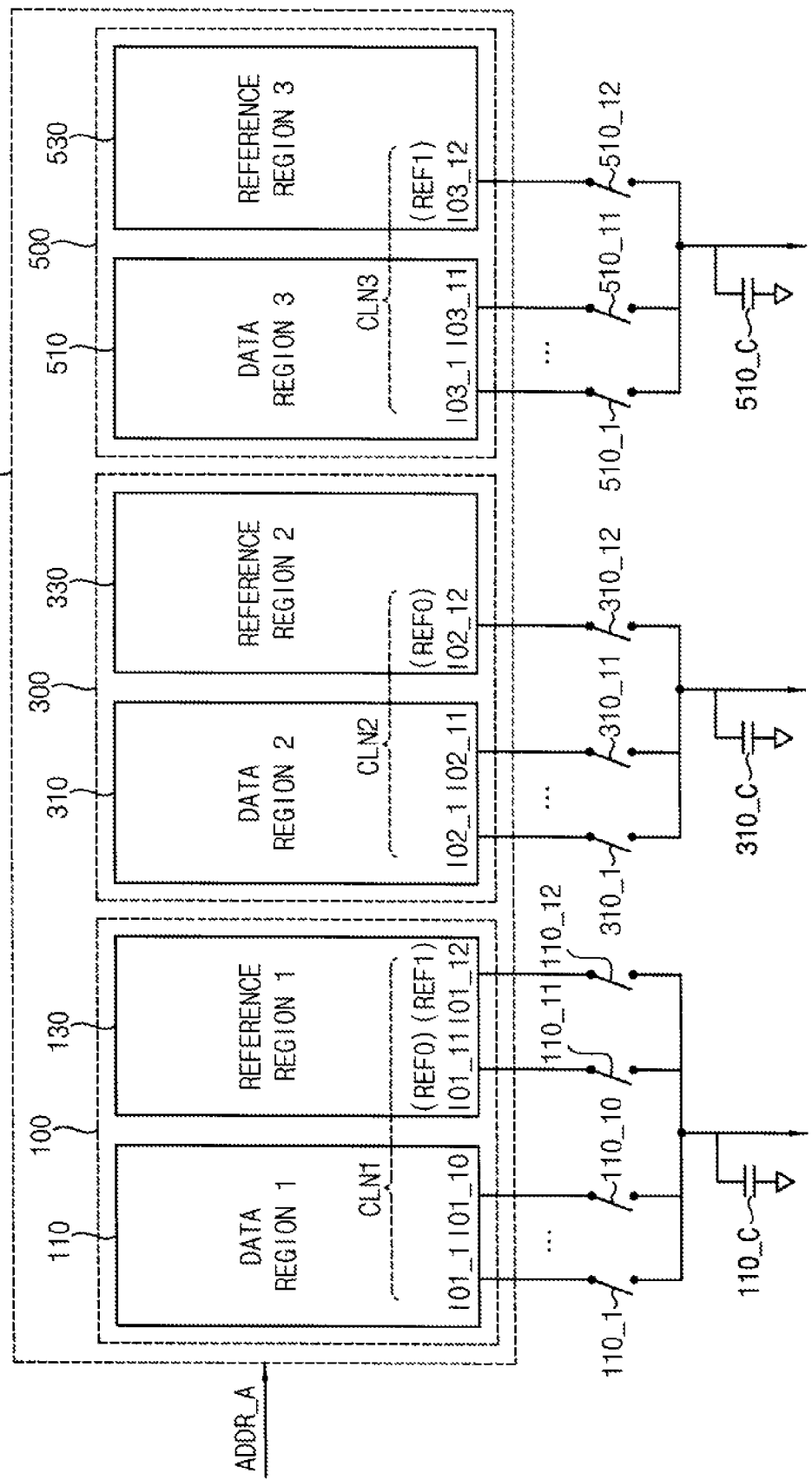
Figure 8:
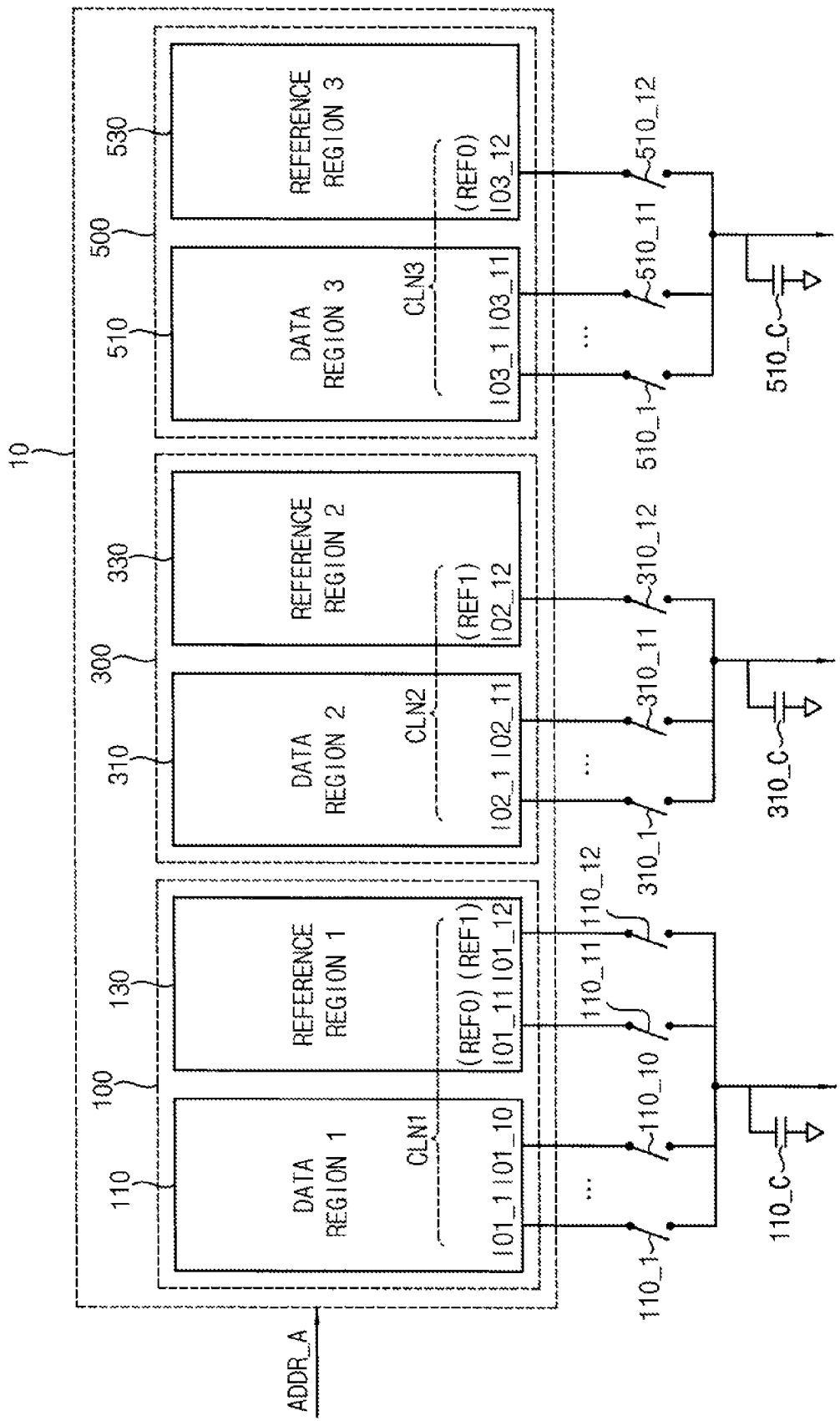

FIGS. 7 and 8 are diagrams illustrating a unit array of a memory device according to example embodiments in case data column line number is 32.

Referring to FIGS. 7 and 8, a unit array 10 of a memory device includes a first section 100, a second section 300 and a third section 500. The first section 100 includes a first data region 110 and a first reference region 130. The second section 300 includes a second data region 310 and a second reference region 330. The third section 500 includes a third data region 510 and a third reference region 530. The first section 100, the second section 300 and the third section 500 output a selection data SD corresponding to an access address ADDR_A, the first reference bit REF0 and the second reference bit REF1 based on the access address ADDR_A.

In case the first column line number CLN1 corresponding to column lines included in the first section 100, the second column line number CLN2 corresponding to column lines included in the second section 300 and the third column line number CLN3 corresponding to column lines included in the third section 500 are the same number, the read speeds of the selection data SD, a first reference bit REF0 and the second reference bit REF1 that are read from the unit array 10 may be equal. In this case, if the number of column lines included in the first reference region 130, the second reference region 330 and the third reference region 530 are decreased, the deviation of the capacitance corresponding to each of the first section 100, the second section 300 and the third section 500 may be minimized. If the deviation of the capacitance corresponding to each of the first section 100, the second section 300 and the third section 500 is minimized, the read speed of the memory device may be maximized.

For example, the number of column lines included in the first data region 110 may be 10. The number of column lines included in the second data region 310 may be 11. The number of column lines included in the third data region 510 may be 11. In this case, the number of column lines included in the first data region 110, the second data region 310 and the third data region 510 may be 32.

For example, the number of column lines included in the first reference region 130 may be 2, the number of column lines included in the second reference region 330 may be 1 and the number of column lines included in the third reference region 530 may be 1. For example, the number CLN1 of column lines included in the first section 100 may be 12. The number CLN2 of column lines included in the second section 300 may be 12. The number CLN3 of column lines included in the third section 500 may be 12.

The parasitic capacitances of the input-output line corresponding to each of column lines included in each section may be equal. The capacitance of each input-output line may be C. The capacitance 110_C corresponding to the first section 100 may be 12C, the capacitance 310_C corresponding to the second section 300 may be 12C and the capacitance 510_C corresponding to the third section 500 may be 12C.

The first column line number CLN1, the second column line number CLN2 and the third column line number CLN3 may be the same number as 12. In an example embodiment, the first column line number CLN1, the second column line number CLN2 and the third column line number CLN3 may be same number.

Referring to FIG. 7, the data region corresponding to the access address ADDR_A may be the first data region 110 included in the first section 100. In case the selection data SD is provided from the first data region 110, the first reference bit REF0 may be provided from the second reference region 330 included in the second section 300 and the second reference bit REF1 may be provided from the third reference region 530 included in the third section 500. For example, the first reference bit REF0 may be used to determine whether the selection data SD is '0'. In addition, the second reference bit REF1 may be used to determine whether the selection data SD is '1'. In addition, the data region corresponding to the access address ADDR_A may be the second data region 310 included in the second section 300. In case the selection data SD is provided from the second data region 310, the first reference bit REF0 may be provided from the first reference region 130 included in the first section 100 and the second reference bit REF1 may be provided from the third reference region 530 included in the third section 500. In addition, data region corresponding to the access address ADDR_A may be the third data region 510 included in the third section 500. In case the selection data SD is provided from the third data region 510, the second reference bit REF1 may be provided from the first reference region 130 included in the first section 100 and the first reference bit REF0 may be provided from the second reference region 330 included in the second section 300. In case the number of column lines included in the first reference region 130 is 2, the number of column lines included in the second reference region 330 is 1 and the number of column lines included in the third reference region 530 is 1, the deviation of the capacitance corresponding to each of the first section 100, the second section 300 and the third section 500 may be minimized. If the deviation of the capacitance corresponding to each of the first section 100, the second section 300 and the third section 500 is minimized, the read speed of the memory device may be maximized.

Referring to FIG. 8, the data region corresponding to the access address ADDR_A may be the first data region 110 included in the first section 100. In case the selection data SD is provided from the first data region 110, the second reference bit REF1 may be provided from the second reference region 330 included in the second section 300 and the first reference bit REF0 may be provided from the third reference region 530 included in the third section 500. In addition, the data region corresponding to the access address ADDR_A may be the second data region 310 included in the second section 300. In case the selection data SD is provided from the second data region 310, the second reference bit REF1 may be provided from the first reference region 130 included in the first section 100 and the first reference bit REF0 may be provided from the third reference region 530 included in the third section 500. In addition, data region corresponding to the access address ADDR_A may be the third data region 510 included in the third section 500. In case the selection data SD is provided from the third data region 510, the first reference bit REF0 may be provided from the first reference region 130 included in the first section 100 and the second reference bit REF1 may be provided from the second reference region 330 included in the second section 300. In case the number of column lines included in the first reference region 130 is 2, the number of column lines included in the second reference region 330 is 1 and the number of column lines included in the third reference region 530 is 1, the deviation of the capacitance corresponding to each of the first section 100, the second section 300 and the third section 500 may be minimized. If the deviation of the capacitance corresponding to each of the first section 100, the second section 300 and the third section 500 is minimized, the read speed of the memory device may be maximized.

Figure 9:
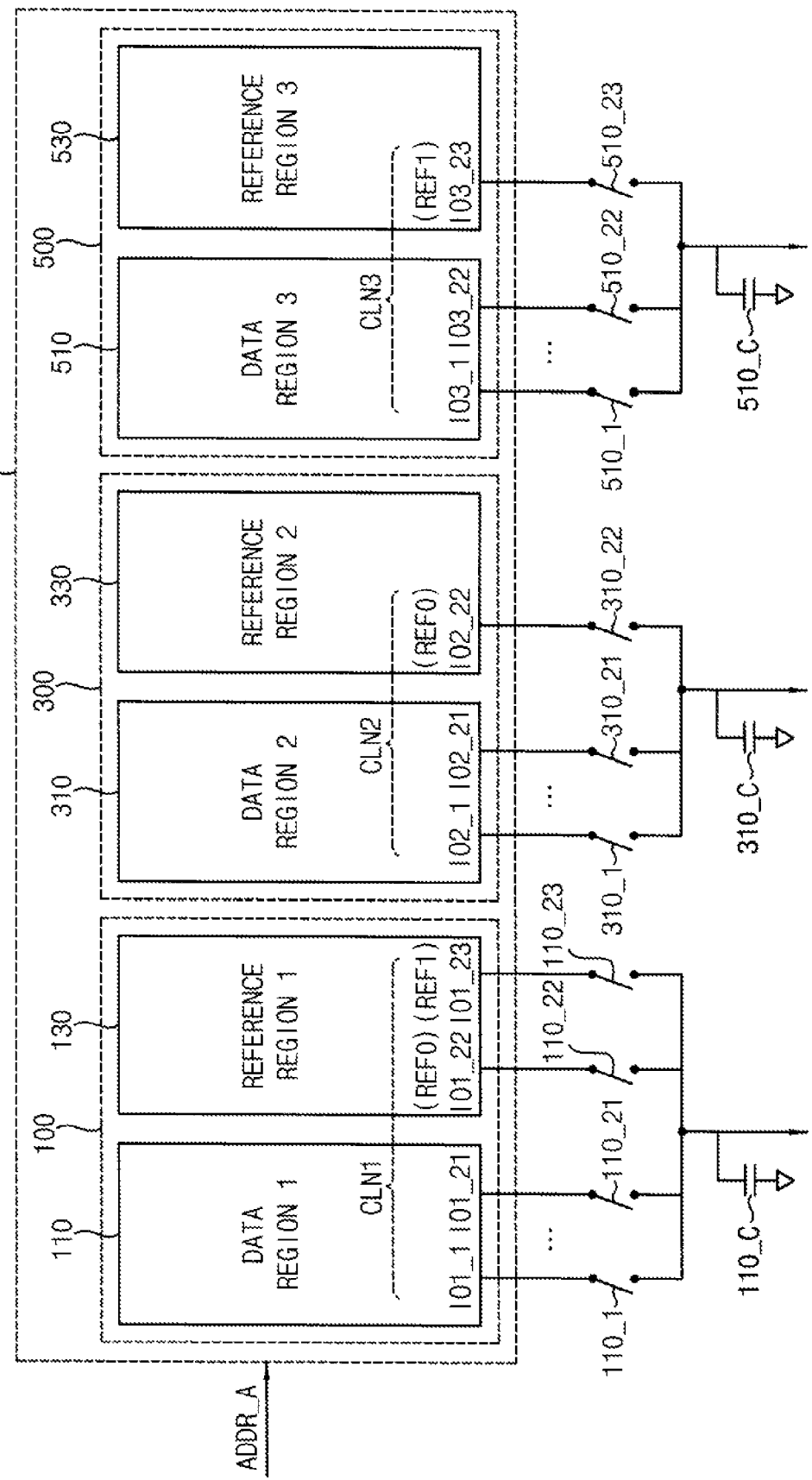
FIGS. 9 and 10 are diagrams illustrating a unit array of a memory device according to example embodiments in a case where a data column line number is 64.
Figure 10:
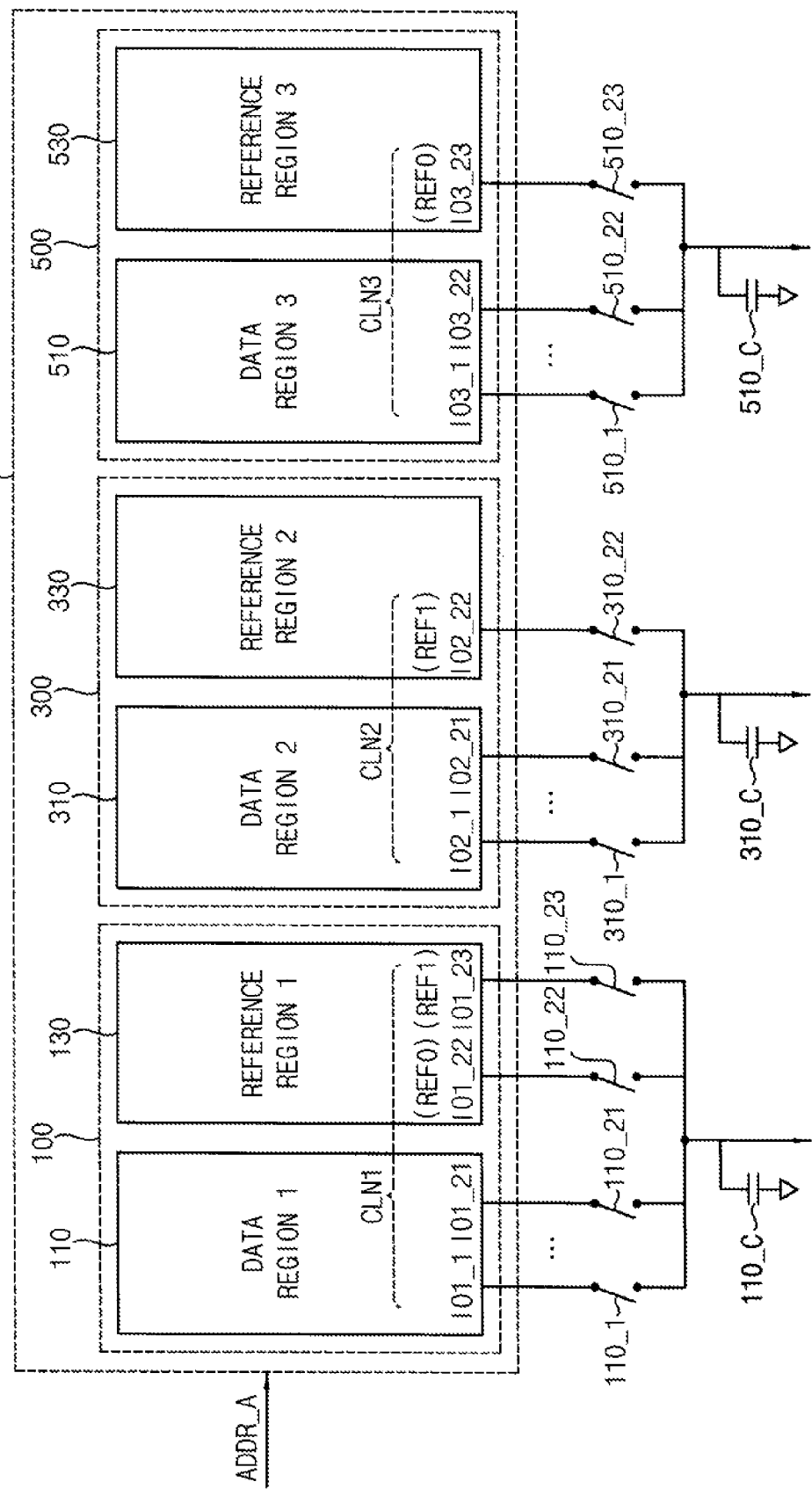

FIGS. 9 and 10 are diagrams illustrating a unit array of a memory device according to example embodiments in case data column line number is 64.

Referring to FIGS. 9 and 10, a unit array 10 of a memory device includes a first section 100, a second section 300 and a third section 500. The first section 100 includes a first data region 110 and a first reference region 130. The second section 300 includes a second data region 310 and a second reference region 330. The third section 500 includes a third data region 510 and a third reference region 530. The first section 100, the second section 300 and the third section 500 output a selection data SD corresponding to an access address ADDR_A, the first reference bit REF0, and the second reference bit REF1 based on the access address ADDR_A.

For example, the number of column lines included in the first data region 110 may be 21. The number of column lines included in the second data region 310 may be 21. The number of column lines included in the third data region 510 may be 22. In this case, the number of column lines included in the first data region 110, the second data region 310 and the third data region 510 may be 64.

For example, the number of column lines included in the first reference region 130 may be 2. The number of column lines included in the second reference region 330 may be 1. The number of column lines included in the third reference region 530 may be 1. For example, the number CLN1 of column lines included in the first section 100 may be 23. The number CLN2 of column lines included in the second section 300 may be 22. The number CLN3 of column lines included in the third section 500 may be 23.

The parasitic capacitances of the input-output line corresponding to each of the column lines included in each section may be equal. The capacitance of each input-output line may be C. The capacitance 110_C corresponding to the first section 100 may be 23C, the capacitance 310_C corresponding to the second section 300 may be 22C and the capacitance 510_C corresponding to the third section 500 may be 23C.

The capacitance 110_C corresponding to the first section 100 and the capacitance 510_C corresponding to the third section 500 may be equal as 23C. In an example embodiment, two column line numbers of the first column line number CLN1, the second column line number CLN2, and the third column line number CLN3 may be same number. In an example embodiment, there is no column line number difference between the number of lines in each of the line groupings in a first and second group of lines (e.g., CLN1 and CLN3), and the line number difference between either of these first and second groups of lines and a third group of lines (e.g., CLN2) is 1.

Referring to FIG. 9, the data region corresponding to the access address ADDR_A may be the first data region 110 included in the first section 100. In case the selection data SD is provided from the first data region 110, the first reference bit REF0 may be provided from the second reference region 330 included in the second section 300, and the second reference bit REF1 may be provided from the third reference region 530 included in the third section 500. For example, the first reference bit REF0 may be used to determine whether the selection data SD is '0'. In addition, the second reference bit REF1 may be used to determine whether the selection data SD is '1'. In addition, the data region corresponding to the access address ADDR_A may be the second data region 310 included in the second section 300. In case the selection data SD is provided from the second data region 310, the first reference bit REF0 may be provided from the first reference region 130 included in the first section 100 and the second reference bit REF1 may be provided from the third reference region 530 included in the third section 500. In addition, data region corresponding to the access address ADDR_A may be the third data region 510 included in the third section 500. In case the selection data SD is provided from the third data region 510, the second reference bit REF1 may be provided from the first reference region 130 included in the first section 100 and the first reference bit REF0 may be provided from the second reference region 330 included in the second section 300. In case the number of column lines included in the first reference region 130 is 2, the number of column lines included in the second reference region 330 is 1 and the number of column lines included in the third reference region 530 is 1, the deviation of the capacitance corresponding to each of the first section 100, the second section 300 and the third section 500 may be minimized. If the deviation of the capacitance corresponding to each of the first section 100, the second section 300, and the third section 500 is minimized, the read speed of the memory device may be maximized.

Referring to FIG. 10, the data region corresponding to the access address ADDR_A may be the first data region 110 included in the first section 100. In case the selection data SD is provided from the first data region 110, the second reference bit REF1 may be provided from the second reference region 330 included in the second section 300 and the first reference bit REF0 may be provided from the third reference region 530 included in the third section 500. In addition, the data region corresponding to the access address ADDR_A may be the second data region 310 included in the second section 300. In case the selection data SD is provided from the second data region 310, the second reference bit REF1 may be provided from the first reference region 130 included in the first section 100 and the first reference bit REF0 may be provided from the third reference region 530 included in the third section 500. In addition, data region corresponding to the access address ADDR_A may be the third data region included in the third section 500. In case the selection data SD is provided from the third data region 510, the first reference bit REF0 may be provided from the first reference region 130 included in the first section 100 and the second reference bit REF1 may be provided from the second reference region 330 included in the second section 300. In case the number of column lines included in the first reference region 130 is 2, the number of column lines included in the second reference region 330 is 1 and the number of column lines included in the third reference region 530 is 1, the deviation of the capacitance corresponding to each of the first section 100, the second section 300 and the third section 500 may be minimized. If the deviation of the capacitance corresponding to each of the first section 100, the second section 300 and the third section 500 is minimized, the read speed of the memory device may be maximized.

Figure 11:
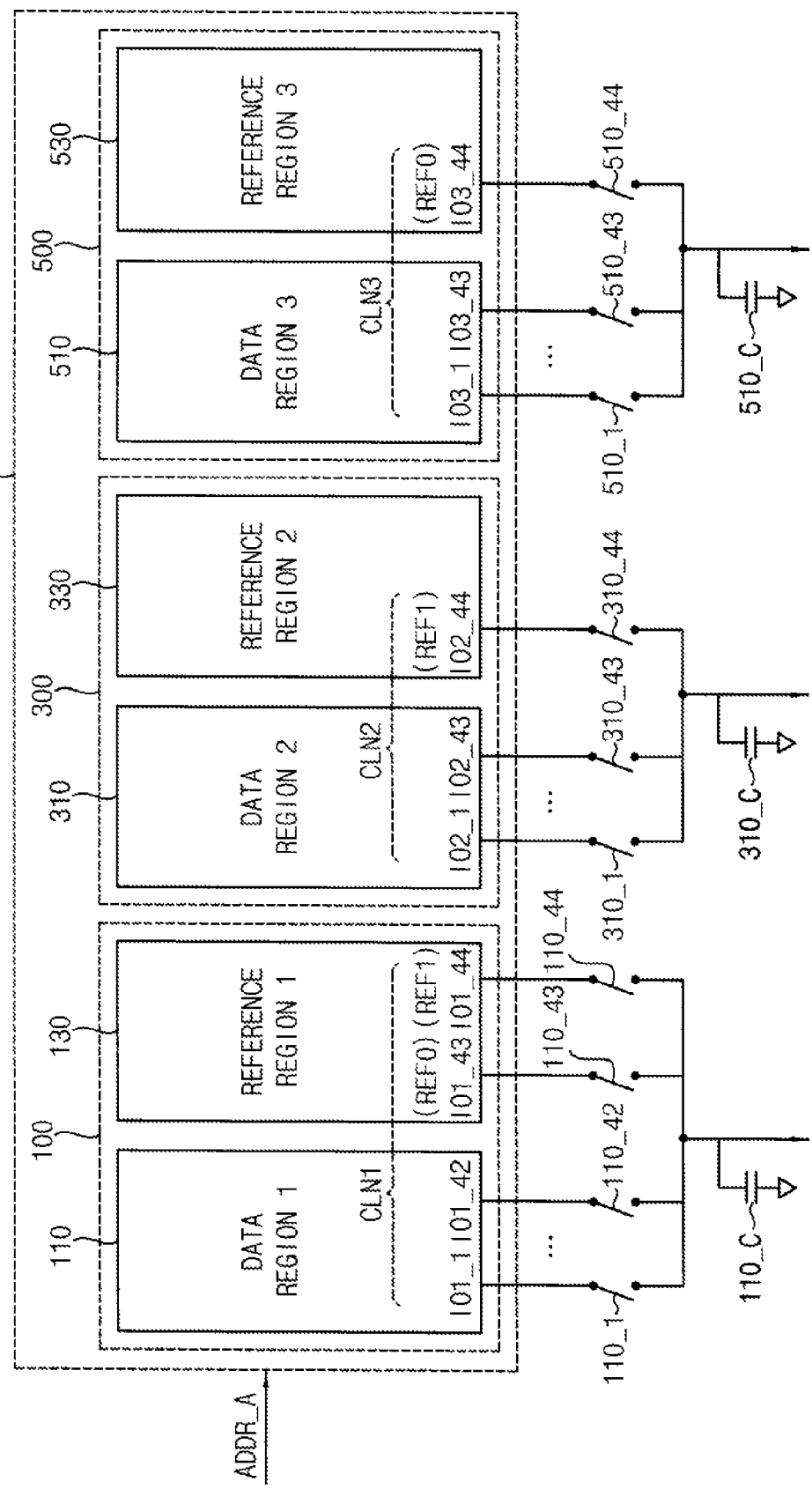
FIGS. 11 and 12 are diagrams illustrating a unit array of a memory device according to example embodiments in a case where a data column line number is 128.
Figure 12:
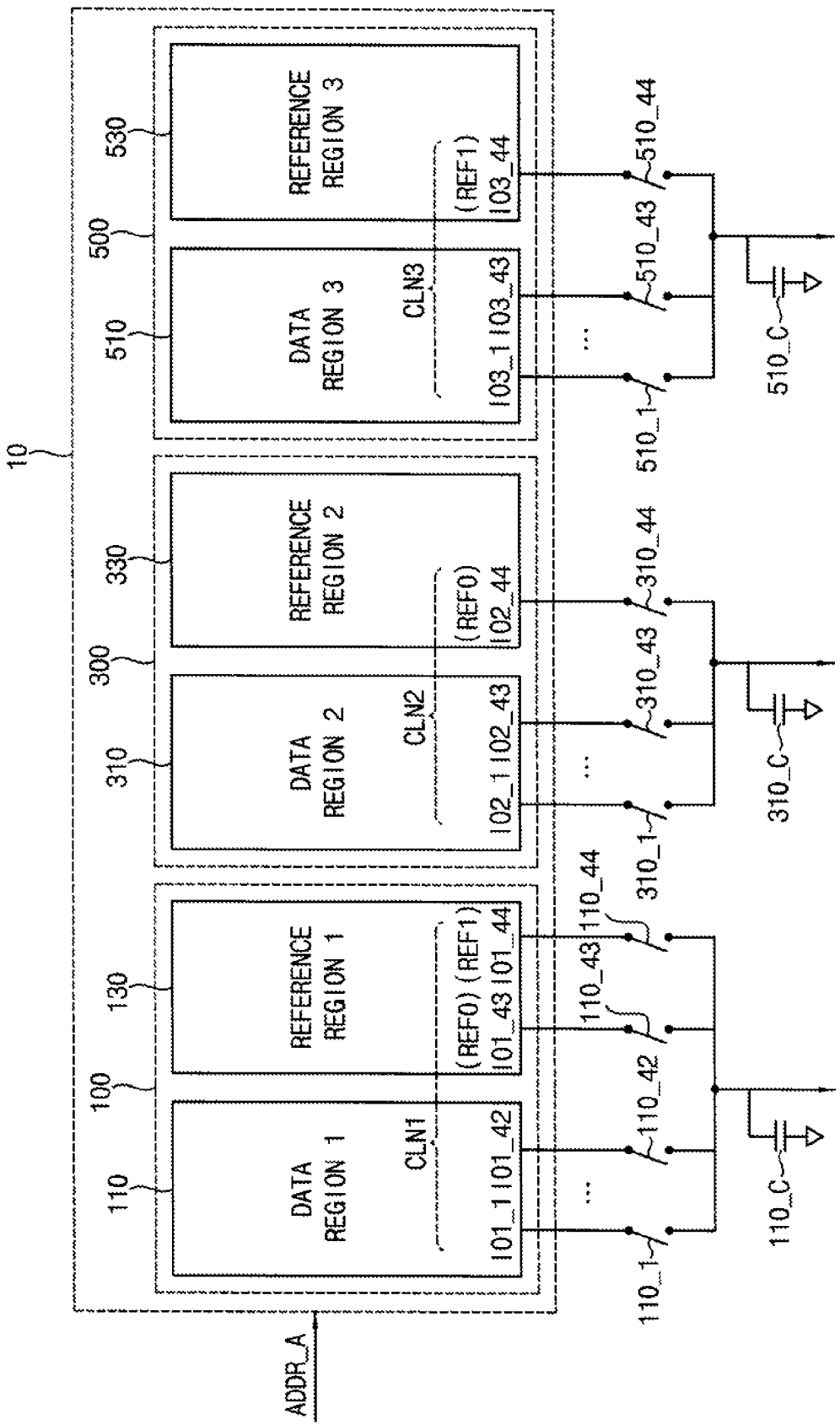

FIGS. 11 and 12 are diagrams illustrating a unit array of a memory device according to example embodiments in case data column line number is 128.

Referring to FIGS. 11 and 12, a unit array 10 of a memory device includes a first section 100, a second section 300 and a third section 500. The first section 100 includes a first data region 110 and a first reference region 130. The second section 300 includes a second data region 310 and a second reference region 330. The third section 500 includes a third data region 510 and a third reference region 530. The first section 100, the second section 300 and the third section 500 output a selection data SD corresponding to an access address ADDR_A, the first reference bit REF0 and the second reference bit REF1 based on the access address ADDR_A.

For example, the number of column lines included in the first data region 110 may be 42. The number of column lines included in the second data region 310 may be 43. The number of column lines included in the third data region 510 may be 43. In this case, the number of column lines included in the first data region 110, the second data region 310 and the third data region 510 may be 128.

For example, the number of column lines included in the first reference region 130 may be 2. The number of column lines included in the second reference region 330 may be 1. The number of column lines included in the third reference region 530 may be 1. For example, the number CLN1 of column lines included in the first section 100 may be 44. The number CLN2 of column lines included in the second section 300 may be 44. The number CLN3 of column lines included in the third section 500 may be 44.

The parasitic capacitances of the input-output line corresponding to each of column lines included in each section may be equal. The capacitance of each input-output line may be C. The capacitance 110_C corresponding to the first section 100 may be 44C, the capacitance 310_C corresponding to the second section 300 may be 44C and the capacitance 510_C corresponding to the third section 500 may be 44C.

The capacitance 110_C corresponding to the first section 100, the capacitance 310_C corresponding to the second section 300 and the capacitance 510_C corresponding to the third section 500 may be equal as 44C. In an example embodiment, the first column line number CLN1, the second column line number CLN2 and the third column line number CLN3 may be same number.

Referring to FIG. 11, the data region corresponding to the access address ADDR_A may be the first data region 110 included in the first section 100. In case the selection data SD is provided from the first data region 110, the first reference bit REF0 may be provided from the second reference region 330 included in the second section 300 and the second reference bit REF1 may be provided from the third reference region 530 included in the third section 500. For example, the first reference bit REF0 may be used to determine whether the selection data SD is '0'. In addition, the second reference bit REF1 may be used to determine whether the selection data SD is '1'. In addition, the data region corresponding to the access address ADDR_A may be the second data region 310 included in the second section 300. In case the selection data SD is provided from the second data region 310, the first reference bit REF0 may be provided from the first reference region 130 included in the first section 100 and the second reference bit REF1 may be provided from the third reference region included in the third section 500. In addition, data region corresponding to the access address ADDR_A may be the third data region 510 included in the third section 500. In case the selection data SD is provided from the third data region 510, the second reference bit REF1 may be provided from the first reference region 130 included in the first section 100 and the first reference bit REF0 may be provided from the second reference region 330 included in the second section 300. In case the number of column lines included in the first reference region 130 is 2, the number of column lines included in the second reference region 330 is 1 and the number of column lines included in the third reference region 530 is 1, the deviation of the capacitance corresponding to each of the first section 100, the second section 300 and the third section 500 may be minimized. If the deviation of the capacitance corresponding to each of the first section 100, the second section 300 and the third section 500 is minimized, the read speed of the memory device may be maximized.

Referring to FIG. 12, the data region corresponding to the access address ADDR_A may be the first data region 110 included in the first section 100. In case the selection data SD is provided from the first data region 110, the second reference bit REF1 may be provided from the second reference region 330 included in the second section 300 and the first reference bit REF0 may be provided from the third reference region 530 included in the third section 500. In addition, the data region corresponding to the access address ADDR_A may be the second data region 310 included in the second section 300. In case the selection data SD is provided from the second data region 310, the second reference bit REF1 may be provided from the first reference region 130 included in the first section 100 and the first reference bit REF0 may be provided from the third reference region 530 included in the third section 500. In addition, data region corresponding to the access address ADDR_A may be the third data region 510 included in the third section 500. In case the selection data SD is provided from the third data region 510, the first reference bit REF0 may be provided from the first reference region 130 included in the first section 100 and the second reference bit REF1 may be provided from the second reference region 330 included in the second section 300. In case the number of column lines included in the first reference region 130 is 2, the number of column lines included in the second reference region 330 is 1 and the number of column lines included in the third reference region 530 is 1, the deviation of the capacitance corresponding to each of the first section 100, the second section 300 and the third section 500 may be minimized. If the deviation of the capacitance corresponding to each of the first section 100, the second section 300 and the third section 500 is minimized, the read speed of the memory device may be maximized.

Figure 13:
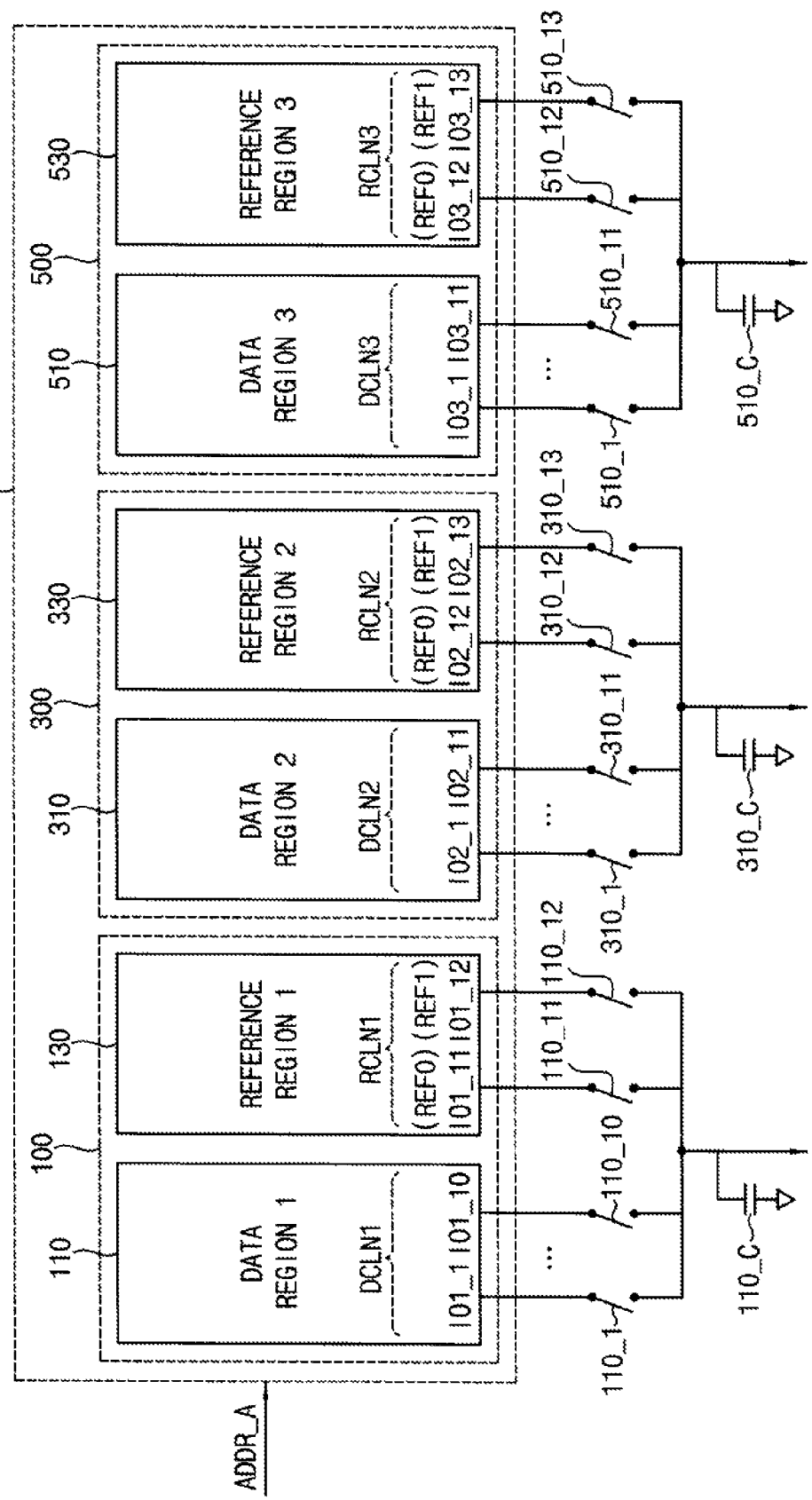
FIG. 13 is a block diagram illustrating an example of reference regions included in a unit array of the memory device of FIGS. 1 to 3 in a case where a data column line number is 32.

FIG. 13 is a block diagram illustrating an example of reference regions included in a unit array of the memory device of FIGS. 1 to 3 in case data column line number is 32.

Referring to FIG. 13, a unit array 10 of a memory device includes a first section 100, a second section 300 and a third section 500. The first section 100 includes a first data region 110 and a first reference region 130. The second section 300 includes a second data region 310 and a second reference region 330. The third section 500 includes a third data region 510 and a third reference region 530. The first section 100, the second section 300 and the third section 500 output a selection data SD corresponding to an access address ADDR_A, the first reference bit REF0 and the second reference bit REF1 based on the access address ADDR_A.

In an example embodiment, the first column line number CLN1 may be a sum of a first data column line number DCLN1 corresponding to a number of column lines included in the first data region 110 and a first reference column line number RCLN1 corresponding to a number of column lines included in the first reference region 130. The second column line number CLN2 may be a sum of a second data column line number DCLN2 corresponding to a number of column lines included in the second data region 310 and a second reference column line number RCLN2 corresponding to a number of column lines included in the second reference region 330. The third column line number CLN3 may be a sum of a third data column line number DCLN3 corresponding to a number of column lines included in the third data region 510 and a third reference column line number RCLN3 corresponding to a number of column lines included in the third reference region 530.

In an example embodiment, the first reference column line number RCLN1, the second reference column line number RCLN2 and the third reference column line number RCLN3 may be 2.

For example, the number of column lines included in the first data region 110 may be 10 and the first data column line number DCLN1 may be 10. The number of column lines included in the second data region 310 may be 11 and the second data column line number DCLN2 may be 11. The number of column lines included in the third data region 510 may be 11 and the third data column line number DCLN3 may be 11.

For example, the number of column lines included in the first reference region 130 may be 2. The number of column lines included in the second reference region 330 may be 2. The number of column lines included in the third reference region 530 may be 1. For example, the number CLN1 of column lines included in the first section 100 may be 12. The number CLN2 of column lines included in the second section 300 may be 13. The number CLN3 of column lines included in the third section 500 may be 13.

The parasitic capacitances of the input-output line corresponding to each of column lines included in each section may be equal. The capacitance of each input-output line may be C. The capacitance 110_C corresponding to the first section 100 may be 12C, the capacitance 310_C corresponding to the second section 300 may be 13C and the capacitance 510_C corresponding to the third section 500 may be 13C.

For example, the data region corresponding to the access address ADDR_A may be the first data region 110 included in the first section 100. In case the selection data SD is provided from the first data region 110, the first reference bit REF0 may be provided from the second reference region 330 included in the second section 300 and the second reference bit REF1 may be provided from the third reference region 530 included in the third section 500. In this case, the capacitance corresponding to each section of the first section 100, the second section 300 and third section 500 may be 12C or 13C. Comparing to FIG. 5, the read speed of the second reference bit REF1 and the selection data SD may be decreased. However, the read speed of the first reference bit REF0 may be increased.

Figure 14:
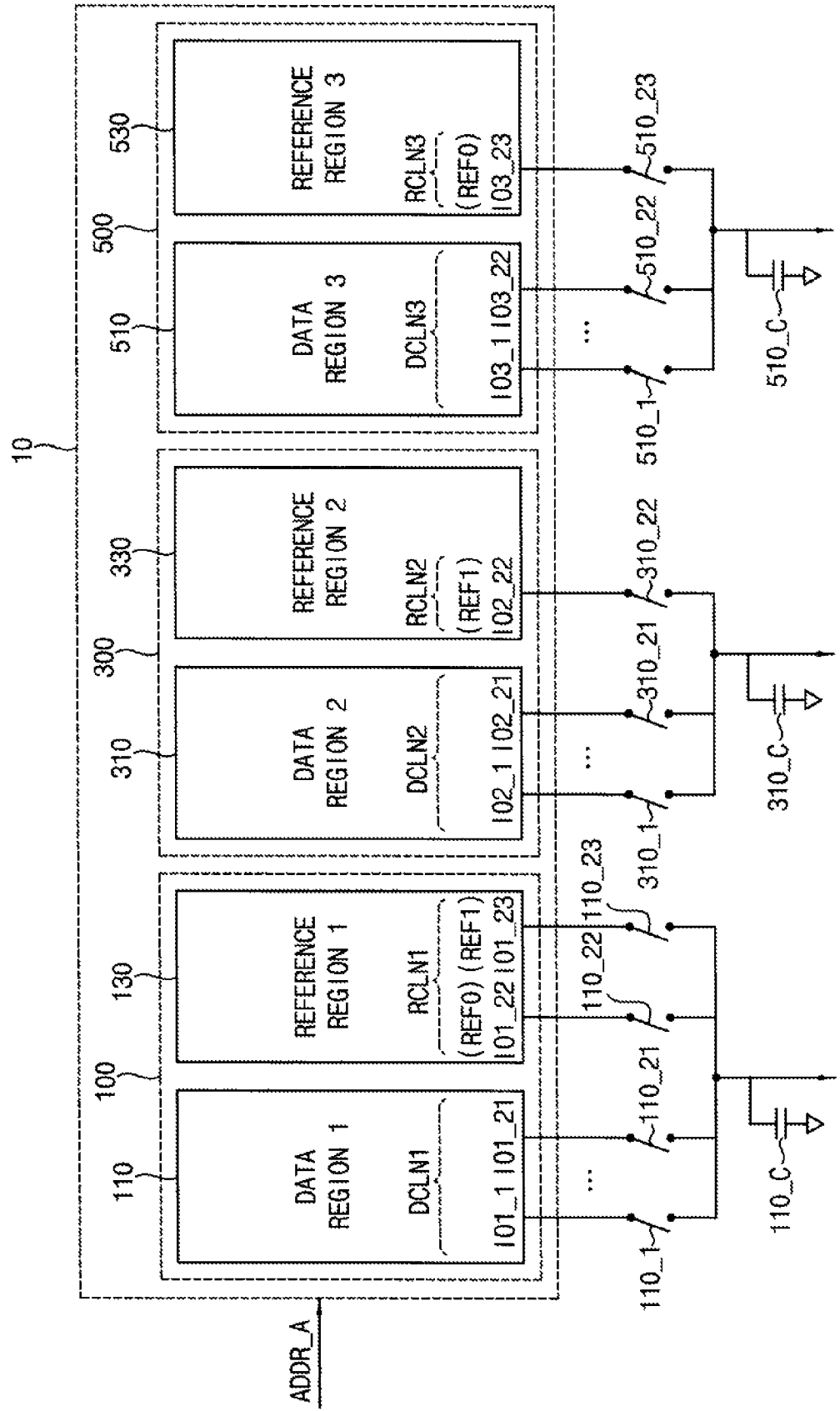
FIGS. 14 to 16 are block diagrams illustrating examples of reference regions included in a unit array of the memory device of FIGS. 1 to 3 in a case where a data column line number is 64.
Figure 15:
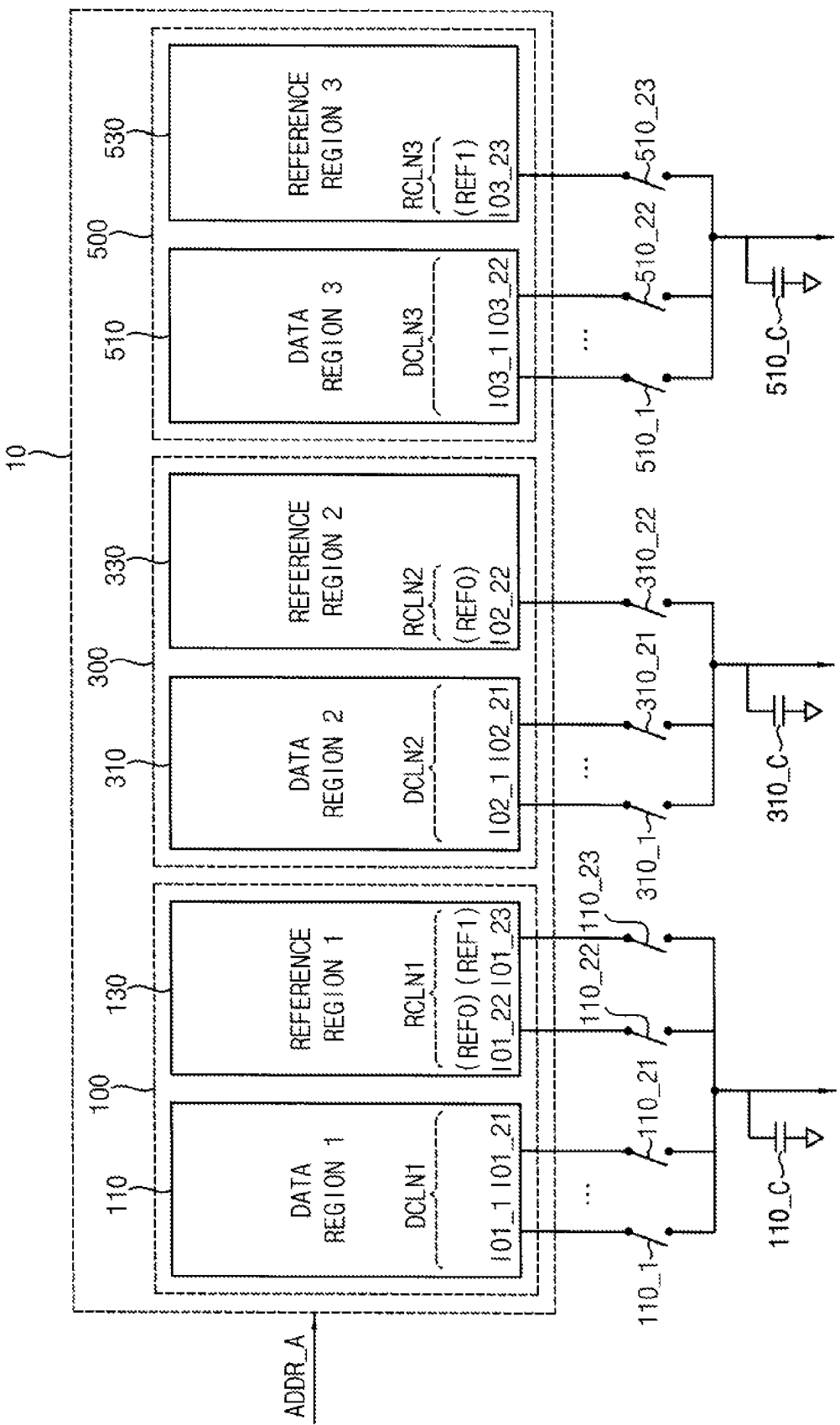

FIGS. 14 and 15 are block diagrams illustrating examples of reference regions included in a unit array of the memory device of FIGS. 1 to 3 in case data column line number is 64.

Referring to FIGS. 14 and 15, a unit array 10 of a memory device includes a first section 100, a second section 300 and a third section 500. The first section 100 includes a first data region 110 and a first reference region 130. The second section 300 includes a second data region 310 and a second reference region 330. The third section 500 includes a third data region 510 and a third reference region 530.

The first section 100, the second section 300 and the third section 500 output a selection data SD corresponding to an access address ADDR_A, the first reference bit REF0 and the second reference bit REF1 based on the access address ADDR_A.

In an example embodiment, the first reference column line number RCLN1, the second reference column line number RCLN2 and the third reference column line number RCLN3 may be determined based on the first data column line number DCLN1, the second data column line number DCLN2 and the third data column line number DCLN3.

In an example embodiment, a reference column line number of a section corresponding to a least data column line number among the first data column line number DCLN1, the second data column line number DCLN2 and the third data column line number DCLN3 may be 2. For example, the number of column lines included in the first data region 110 may be 21 and the first data column line number DCLN1 may be 21. The number of column lines included in the second data region 310 may be 21 and the second data column line number DCLN2 may be 21. The number of column lines included in the third data region 510 may be 22 and the third data column line number DCLN3 may be 22. In this case, the number of column lines included in the first data region 110, the second data region 310 and the third data region 510 may be 64. the data column line number may be 64.

The least data column line number among the first data column line number DCLN1, the second data column line number DCLN2 and the third data column line number DCLN3 may be 21. The section corresponding to the least data column line number may be the first section 100 and the second section 300. In this case, the number of column lines included in the first reference region 130 may be 2. The number of column lines included in the second reference region 330 may be 1. The number of column lines included in the third reference region 530 may be 1.

Referring to FIG. 14, the data region corresponding to the access address ADDR_A may be the first data region 110 included in the first section 100. In case the selection data SD is provided from the first data region 110, the first reference bit REF0 may be provided from the second reference region 330 included in the second section 300 and the second reference bit REF1 may be provided from the third reference region 530 included in the third section 500. For example, the first reference bit REF0 may be used to determine whether the selection data SD is '0'. In addition, the second reference bit REF1 may be used to determine whether the selection data SD is '1'. In addition, the data region corresponding to the access address ADDR_A may be the second data region 310 included in the second section 300. In case the selection data SD is provided from the second data region 310, the first reference bit REF0 may be provided from the first reference region 130 included in the first section 100 and the second reference bit REF1 may be provided from the third reference region 530 included in the third section 500. In addition, data region corresponding to the access address ADDR_A may be the third data region 510 included in the third section 500. In case the selection data SD is provided from the third data region 510, the second reference bit REF1 may be provided from the first reference region 130 included in the first section 100 and the first reference bit REF0 may be provided from the second reference region 330 included in the second section 300. In case the number of column lines included in the first reference region 130 is 2, the number of column lines included in the second reference region 330 is 1 and the number of column lines included in the third reference region 530 is 1, the deviation of the capacitance corresponding to each of the first section 100, the second section 300 and the third section 500 may be minimized. If the deviation of the capacitance corresponding to each of the first section 100, the second section 300 and the third section 500 is minimized, the read speed of the memory device may be maximized.

In an example embodiment, in case a remainder of a data column line number corresponding to a sum of the first data column line number DCLN1, the second data column line number DCLN2 and the third data column line number DCLN3 divided by 3 is 1, the first data column line number DCLN1 and the second data column line number DCLN2 may be a quotient of the data column line number divided by 3. The third data column line number DCLN3 may be the quotient plus 1. For example, the data column line number may be the sum of the first data column line number DCLN1, the second data column line number DCLN2 and the third data column line number DCLN3. The data column line number may be 64. The quotient of the data column line number divided by 3 may be 21. The remainder of the data column line number divided by 3 may be 1. If the column line number corresponding to each section is determined to decrease the deviation of the number of column lines corresponding to each of the first section 100, the second section 300 and the third section 500, the read speed of the selection data SD, the first reference bit REF0 and the second reference bit REF1 may be increased.

For example, in case the data column line number is 64, the first data column line number DCLN1 is 21, the second data column line number DCLN2 is 21 and the third data column line number DCLN3 is 22. In this case, the first reference bit REF0 and the second reference bit REF1 may be stored in the first reference region 130. The number of column lines included in the first reference region 130 may be 2. The second reference bit REF1 may be stored in the second reference region 330. The number of column line included in the second reference region 330 may be 1. The first reference bit REF0 may be stored in the third reference region 530. The number of column line included in the third reference region 530 may be 1. In this case, the number of column lines corresponding to the first section 100 may be 23. The number of column lines corresponding to the second section 300 may be 22. The number of column lines corresponding to the third section 500 may be 23. If the column line number corresponding to each section is determined to decrease the deviation of the number of column lines corresponding to each of the first section 100, the second section 300 and the third section 500, the read speed of the selection data SD, the first reference bit REF0 and the second reference bit REF1 may be increased.

Referring to FIG. 15, the data region corresponding to the access address ADDR_A may be the first data region 110 included in the first section 100. In case the selection data SD is provided from the first data region 110, the second reference bit REF1 may be provided from the second reference region 330 included in the second section 300 and the first reference bit REF0 may be provided from the third reference region 530 included in the third section 500. In addition, the data region corresponding to the access address ADDR_A may be the second data region 310 included in the second section 300. In case the selection data SD is provided from the second data region 310, the second reference bit REF1 may be provided from the first reference region 130 included in the first section 100 and the first reference bit REF0 may be provided from the third reference region 530 included in the third section 500. In addition, data region corresponding to the access address ADDR_A may be the third data region 510 included in the third section 500. In case the selection data SD is provided from the third data region 510, the first reference bit REF0 may be provided from the first reference region 130 included in the first section 100 and the second reference bit REF1 may be provided from the second reference region 330 included in the second section 300. Therefore, In case the number of column lines included in the first reference region 130 is 2, the number of column lines included in the second reference region 330 is 1 and the number of column lines included in the third reference region 530 is 1, the deviation of the capacitance corresponding to each of the first section 100, the second section 300 and the third section 500 may be minimized. If the deviation of the capacitance corresponding to each of the first section 100, the second section 300 and the third section 500 is minimized, the read speed of the memory device may be maximized.

In an example embodiment, a reference column line number of a section corresponding to a greatest data column line number among the first data column line number DCLN1, the second data column line number DCLN2 and the third data column line number DCLN3 may be 1. The section corresponding to the greatest data column line number may provide one of the first reference bit REF0 and the second reference bit REF1.

For example, the number of column lines included in the first data region 110 may be 21 and the first data column line number DCLN1 may be 21. The number of column lines included in the second data region 310 may be 21 and the second data column line number DCLN2 may be 21. The number of column lines included in the third data region 510 may be 22 and the third data column line number DCLN3 may be 22. The number of column lines of a section corresponding to a greatest data column line number among the first data column line number DCLN1, the second data column line number DCLN2 and the third data column line number DCLN3 may be the third data column line number DCLN3. the third data column line number DCLN3 may be 22. the reference column line number of the third section 500 corresponding to the third data column line number DCLN3 may be 1. In case the first reference bit REF0 is stored in the third reference region 530, the first reference bit REF0 may be provided through the reference column line of the third section 500. In case the second reference bit REF1 is stored in the third reference region 530, the second reference bit REF1 may be provided through the reference column line of the third section 500.

For example, in case the data column line number is 64, the first data column line number DCLN1 may be 21, the second data column line number DCLN2 may be 21 and the third data column line number DCLN3 may be 22. In this case, the first reference bit REF0 and the second reference bit REF1 may be stored in the first reference region 130. The number of column lines included in the first reference region 130 may be 2. The first reference bit REF0 may be stored in the second reference region 330. The number of column line included in the second reference region 330 may be 1. The second reference bit REF1 may be stored in the third reference region 530. The number of column line included in the third reference region 530 may be 1. In this case, the number of column lines corresponding to the first section 100 may be 23. The number of column lines corresponding to the second section 300 may be 22. The number of column lines corresponding to the third section 500 may be 23. If the column line number corresponding to each section is determined to decrease the deviation of the number of column lines corresponding to each of the first section 100, the second section 300 and the third section 500, the read speed of the selection data SD, the first reference bit REF0 and the second reference bit REF1 may be increased.

In an example embodiment, the first reference column line number RCLN1 may be 2. The second reference column line number RCLN2 and the third reference column line number RCLN3 may be 1.

In an example embodiment, in case the second reference region 330 stores the first reference bit REF0, the third reference region 530 may store the second reference bit REF1. For example, the first reference bit REF0 may be used to determine whether the selection data SD is '0'. In addition, the second reference bit REF1 may be used to determine whether the selection data SD is '1'. In case the selection data SD is provided from the first data region 110, the first reference bit REF0 may be provided from the second reference region 330 included in the second section 300 and the second reference bit REF1 may be provided from the third reference region 530 included in the third section 500.

In an example embodiment, in case the second reference region 330 stores the second reference bit REF1, the third reference region 530 may store the first reference bit REF0. For example, In case the selection data SD is provided from the first data region 110, the second reference bit REF1 may be provided from the second reference region 330 included in the second section 300 and the first reference bit REF0 may be provided from the third reference region 530 included in the third section 500.

Figure 16:
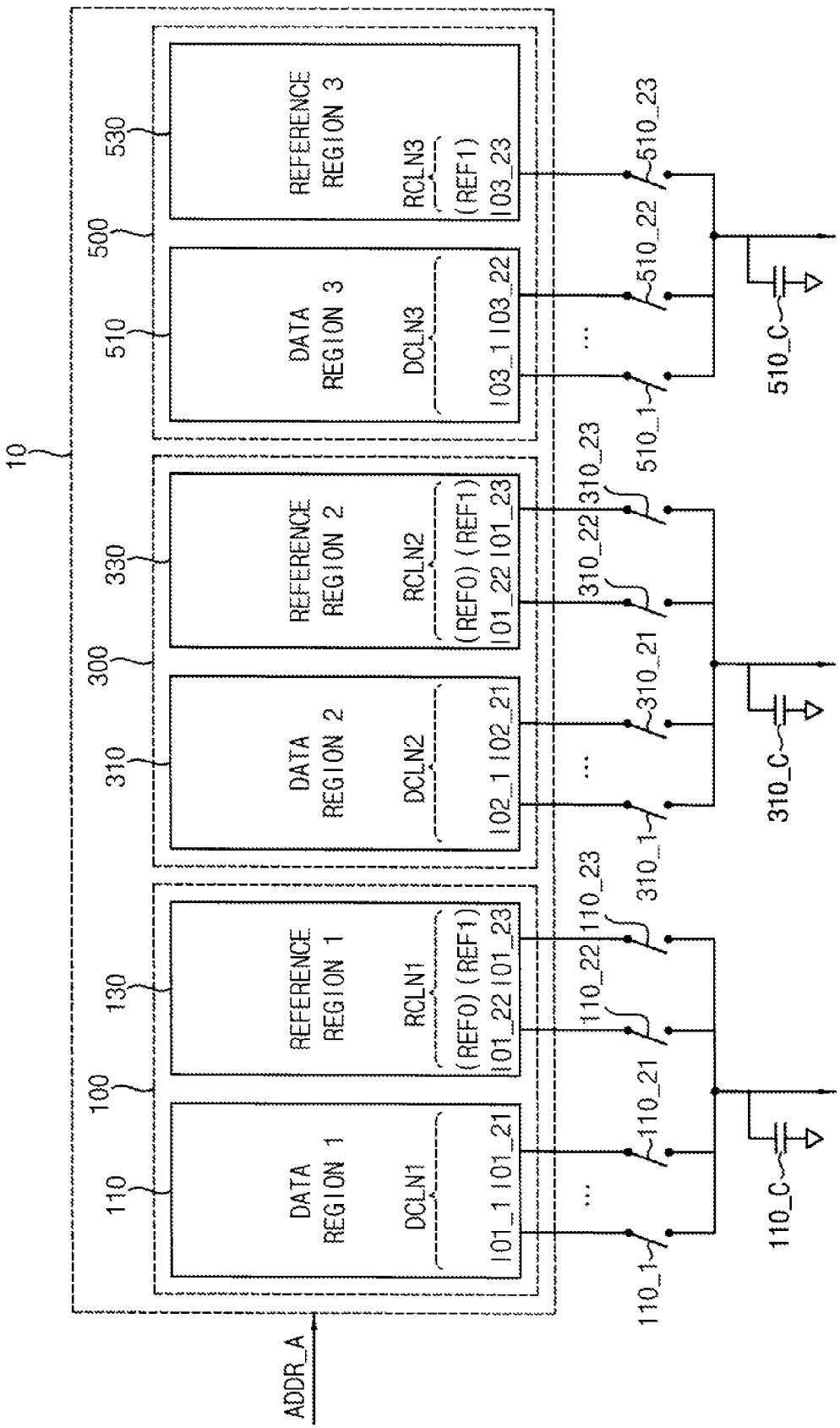

FIG. 16 is a block diagram illustrating example of reference regions included in a unit array of the memory device of FIGS. 1 to 3 in case data column line number is 64.

Referring to FIG. 16, a unit array 10 of a memory device includes a first section 100, a second section 300 and a third section 500. The first section 100 includes a first data region 110 and a first reference region 130. The second section 300 includes a second data region 310 and a second reference region 330. The third section 500 includes a third data region 510 and a third reference region 530. The first section 100, the second section 300 and the third section 500 output a selection data SD corresponding to an access address ADDR_A, the first reference bit REF0 and the second reference bit REF1 based on the access address ADDR_A.

As described in FIGS. 14 and 15, the number of column lines corresponding to the first section 100 may be 23. The number of column lines corresponding to the second section 300 may be 22. The number of column lines corresponding to the third section 500 may be 23.

The parasitic capacitances of the input-output line corresponding to each of column lines included in each section may be equal. The capacitance of each input-output line may be C. The capacitance 110_C corresponding to the first section 100 may be 23C, the capacitance 310_C corresponding to the second section 300 may be 22C and the capacitance 510_C corresponding to the third section 500 may be 23C. The read speed may be determined based on the capacitance corresponding to each section. As the capacitance corresponding to each section is increased, the read speed may be decreased. In case the selection data SD is read from the first section 100, the first reference bit REF0 is read from the second section 300 and the second reference bit REF1 is read from the third section 500, because the capacitance 310_C corresponding to the second section 300 is the smallest, the read speed of the first reference bit REF0 may be the fastest. Because the capacitance 110_C corresponding to the first section 100 and the capacitance 310_C corresponding to the second section 300 are greater than the capacitance 310_C corresponding to the second section 300, the read speed of the selection data SD and the second reference bit REF1 may be slower than the read speed of the first reference bit REF0. Therefore, the read speed of the memory device including the unit array 10 may be determined by the read speed of the selection data SD and the second reference bit REF1 that are provided from the first section 100 and the third section 500.

In an example embodiment, the first reference column line number RCLN1 and the second reference column line number RCLN2 may be 2. The third reference column line number RCLN3 may be 1. For example, in case the data column line number is 64, the first data column line number DCLN1 is 21, the second data column line number DCLN2 is 21 and the third data column line number DCLN3 is 22. In this case, the first reference bit REF0 and the second reference bit REF1 may be stored in the first reference region 130. The number of column lines included in the first reference region 130 may be 2. The first reference bit REF0 and the second reference bit REF1 may be stored in the second reference region 330. The number of column line included in the second reference region 330 may be 2. The first reference bit REF0 may be stored in the third reference region 530. The number of column line included in the third reference region 530 may be 1. In this case, the number of column lines corresponding to the first section 100 may be 23. The number of column lines corresponding to the second section 300 may be 23. The number of column lines corresponding to the third section 500 may be 23.

The parasitic capacitances of the input-output line corresponding to each of column lines included in each section may be equal. The capacitance of each input-output line may be C. The capacitance 110_C corresponding to the first section 100 may be 23C, the capacitance 310_C corresponding to the second section 300 may be 23C and the capacitance 510_C corresponding to the third section 500 may be 23C. The read speed may be determined based on the capacitance corresponding to each section. As the capacitance corresponding to each section is increased, the read speed may be decreased. In case the selection data SD is read from the first section 100, the first reference bit REF0 is read from the second section 300 and the second reference bit REF1 is read from the third section 500, because the capacitances corresponding to the first section 100, the second section 300 and the third section 500 are equal, the read speeds of the selection data SD, the first reference bit REF0 and the second reference bit REF1 may be equal. Even though the number of column lines included in the second reference region 330 of the unit array 10 of FIGS. 14 and 15 is increased by 1, the read speed of the memory device including the unit array 10 may not be changed.

In an example embodiment, the third reference region 530 may provide one of the first reference bit REF0 and the second reference bit REF1.

For example, in case the first reference bit REF0 and the secont reference bit are stored in the first reference region 130 and the first reference bit REF0 and the secont reference bit are stored in the second reference region 330, the only first reference bit REF0 may be stored in the third reference region 530. The data region corresponding to the access address ADDR_A may be the first data region 110 included in the first section 100. In case the selection data SD is provided from the first data region 110, the second reference bit REF1 may be provided from the second reference region 330 and the first reference bit REF0 may be provided from the third reference region 530. In addition, the data region corresponding to the access address ADDR_A may be the second data region 310 included in the second section 300. In case the selection data SD is provided from the second data region 310, the second reference bit REF1 may be provided from the first reference region 130 and the first reference bit REF0 may be provided from the third reference region 530.

For example, in case the first reference bit REF0 and the secont reference bit are stored in the first reference region 130 and the first reference bit REF0 and the secont reference bit are stored in the second reference region 330, the only second reference bit REF1 may be stored in the third reference region 530. The data region corresponding to the access address ADDR_A may be the first data region 110 included in the first section 100. In case the selection data SD is provided from the first data region 110, the first reference bit REF0 may be provided from the second reference region 330 and the second reference bit REF1 may be provided from the third reference region 530. In addition, the data region corresponding to the access address ADDR_A may be the second data region 310 included in the second section 300. In case the selection data SD is provided from the second data region 310, the first reference bit REF0 may be provided from the first reference region 130 and the second reference bit REF1 may be provided from the third reference region 530.

Figure 17:
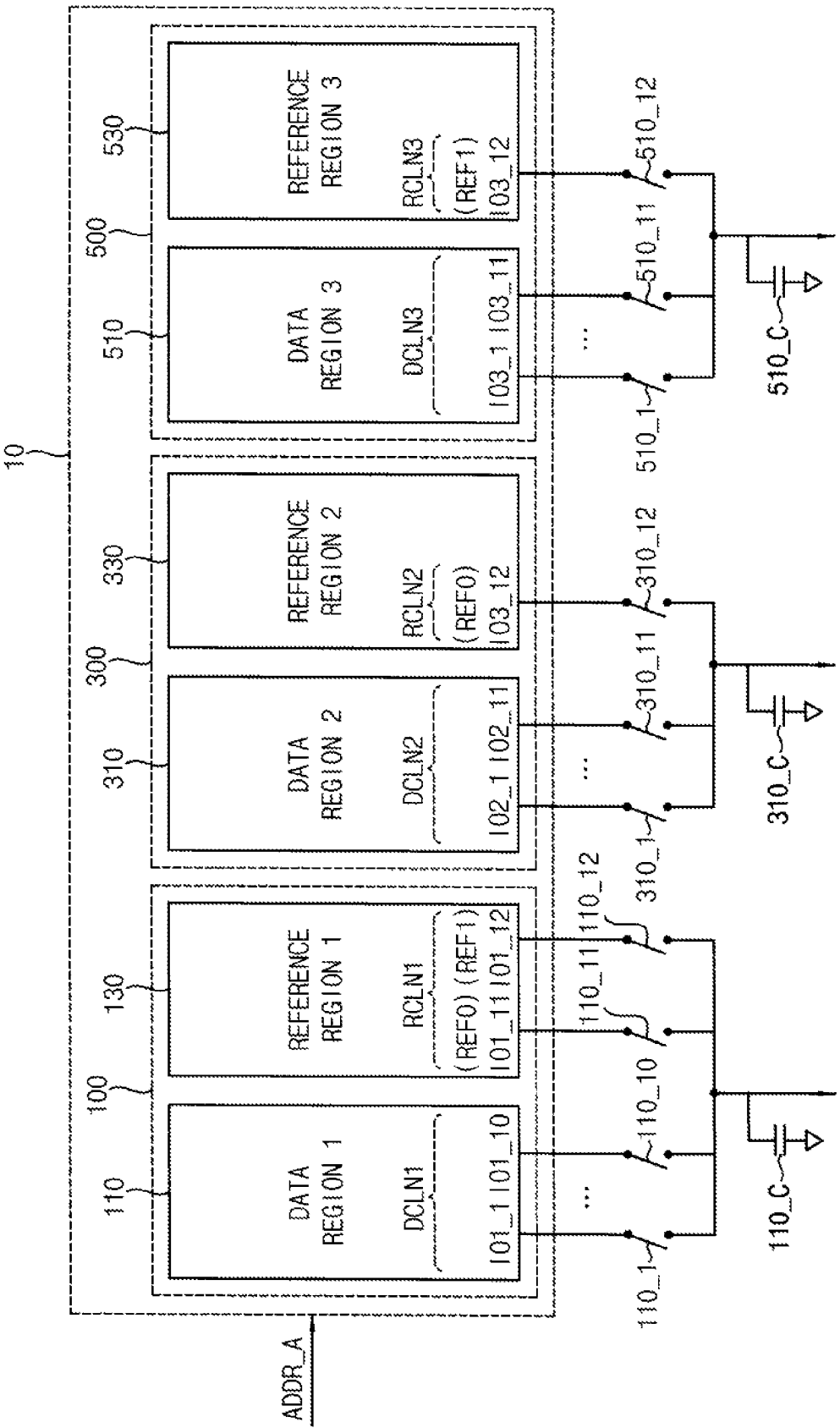
FIG. 17 is a block diagram illustrating another example of reference regions included in a unit array of the memory device of FIGS. 1 to 3 in a case where a data column line number is 32.

FIG. 17 is a block diagram illustrating another example of reference regions included in a unit array of the memory device of FIGS. 1 to 3 in case data column line number is 32.

Referring to FIG. 17, a unit array 10 of a memory device includes a first section 100, a second section 300 and a third section 500. The first section 100 includes a first data region 110 and a first reference region 130. The second section 300 includes a second data region 310 and a second reference region 330. The third section 500 includes a third data region 510 and a third reference region 530. The first section 100, the second section 300 and the third section 500 output a selection data SD corresponding to an access address ADDR_A, the first reference bit REF0 and the second reference bit REF1 based on the access address ADDR_A.

In an example embodiment, in case a remainder of a data column line number corresponding to a sum of the first data column line number DCLN1, the second data column line number DCLN2 and the third data column line number DCLN3 divided by 3 is 2, the first data column line number DCLN1 may be a quotient of the data column line number divided by 3 and the second data column line number DCLN2 and the third data column line number DCLN3 may be the quotient plus 1. For example, the data column line number may be a sum of the first data column line number DCLN1, the second data column line number DCLN2 and the third data column line number DCLN3. The data column line number may be 32. The quotient of the data column line number divided by 3 may be 10. The remainder of the data column line number divided by 3 may be 2. If the column line number corresponding to each section is determined to decrease the deviation of the number of column lines corresponding to each of the first section 100, the second section 300 and the third section 500, the read speed of the selection data SD, the first reference bit REF0 and the second reference bit REF1 may be increased.

For example, in case the data column line number is 32, the first data column line number DCLN1 is 10, the second data column line number DCLN2 is 11 and the third data column line number DCLN3 is 11. In this case, the first reference bit REF0 and the second reference bit REF1 may be stored in the first reference region 130. The number of column lines included in the first reference region 130 may be 2. The first reference bit REF0 may be stored in the second reference region 330. The number of column line included in the second reference region 330 may be 1. The second reference bit REF1 may be stored in the third reference region 530. The number of column line included in the third reference region 530 may be 1. In this case, the number of column lines corresponding to the first section 100 may be 12. The number of column lines corresponding to the second section 300 may be 12. The number of column lines corresponding to the third section 500 may be 12. If the column line number corresponding to each section is determined to decrease the deviation of the number of column lines corresponding to each of the first section 100, the second section 300 and the third section 500, the read speed of the selection data SD, the first reference bit REF0 and the second reference bit REF1 may be increased.

In an example embodiment, the first reference column line number RCLN1 may be 2 and the second reference column line number RCLN2 and the third reference column line number RCLN3 may be 1.

In an example embodiment, in case the second reference region 330 stores the first reference bit REF0, the third reference region 530 may store the second reference bit REF1. For example, the first reference bit REF0 may be used to determine whether the selection data SD is '0'. In addition, the second reference bit REF1 may be used to determine whether the selection data SD is '1'. In case the selection data SD is provided from the first data region 110, the first reference bit REF0 and the second reference bit REF1 may be provided from the second section 300 and the third section 500. For example, In case the selection data SD is provided from the first data region 110, the first reference bit REF0 may be provided from the second reference region 330 included in the second section 300 and the second reference bit REF1 may be provided from the third reference region 530 included in the third section 500.

Figure 18:
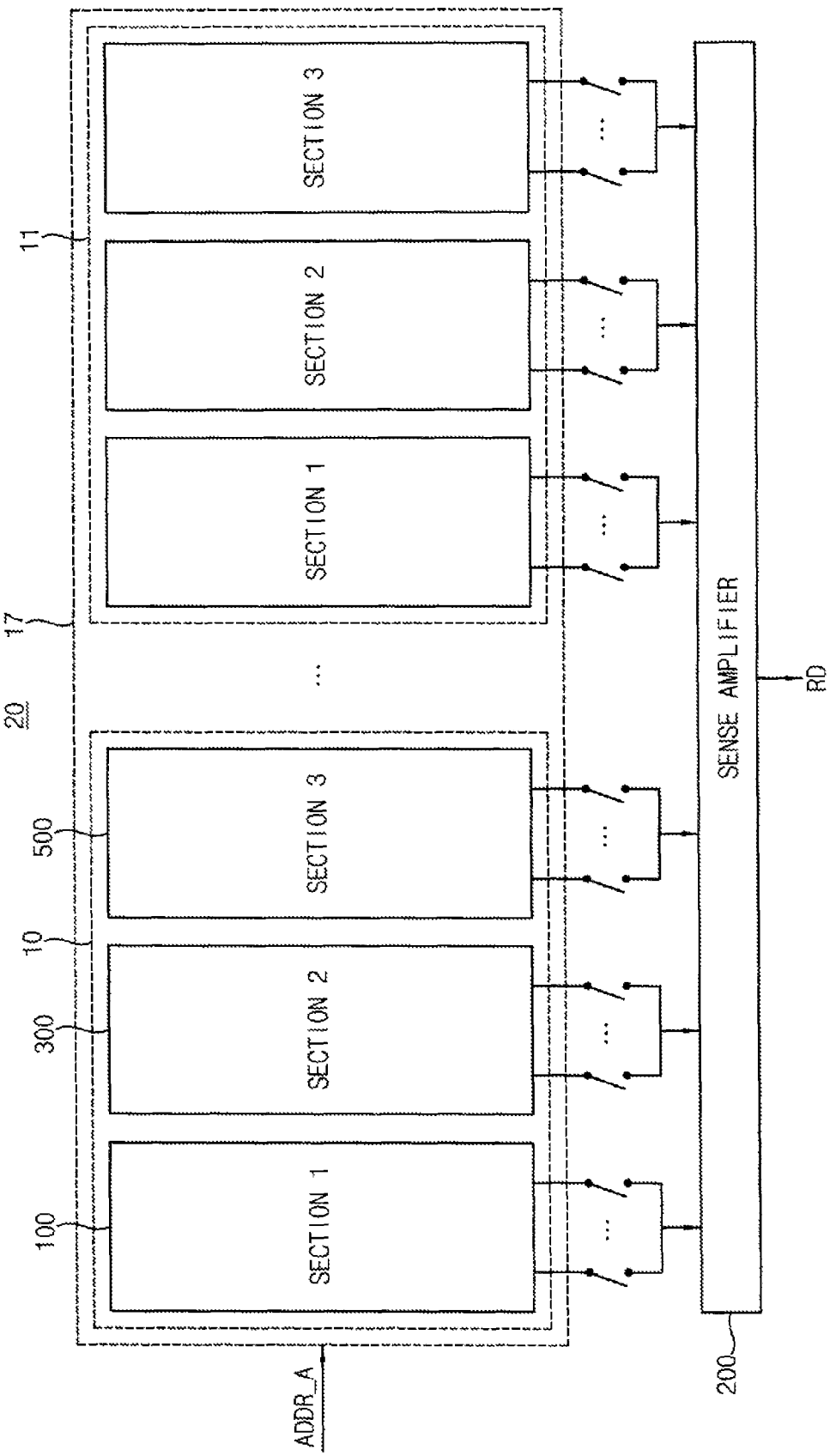
FIG. 18 is a block diagram illustrating a memory device according to example embodiments.

FIG. 18 is a block diagram illustrating a memory device according to example embodiments.

Referring to FIGS. 1 and 18, a memory device includes a memory cell array and a sense amplifier circuit. The memory cell array includes unit arrays 10. For example, each unit array may include $2^n$ data cells (e.g., memory cells) and/or $2^n$ columns of data cells (e.g., memory cells). Each unit array 10 includes a first section 100, a second section 300 and a third section 500. The unit arrays 10 provide a selection data SD corresponding to an access address ADDR_A, a first reference bit REF0, and a second reference bit REF1 based on the access address ADDR_A. Examples of how a reference value or a reference bit of two reference cells can be used to determine the state of stored data can be seen, for example, in U.S. Pat. Nos. 8,665,638, 8,587,994, 7,733,729, and 6,388,917, and in U.S. Patent Application Publication Nos. 2011/0188305, and 2008/0094884, all of which are incorporated herein by reference in their entirety. The sense amplifier provides read data based on the selection data SD, the first reference bit REF0 and the second reference bit REF1. The first section 100 includes a first data region 110 and a first reference region 130. The first reference region 130 stores at least one of the first reference bit REF0 and the second reference bit REF1. The second section 300 includes a second data region 310 and a second reference region 330. The second reference region 330 stores at least one of the first reference bit REF0 and the second reference bit REF1. The third section 500 includes a third data region 510 and a third reference region 530. The third reference region 530 stores at least one of the first reference bit REF0 and the second reference bit REF1. For example, each reference bit may be a bit stored at a reference cell that has a certain reference value (e.g. REF0 or REF1, which may correspond to a logic '0' and logic '1' respectively). The first section 100, the second section 300 and the third section 500 output a selection data SD corresponding to an access address ADDR_A, the first reference bit REF0, and the second reference bit REF1 based on the access address ADDR_A.

For example, data region corresponding to the access address ADDR_A may be the first data region 110 included in the first section 100. In case the selection data SD is provided from the first data region 110, the first reference bit REF0 may be provided from the second reference region 330 included in the second section 300 and the second reference bit REF1 may be provided from the third reference region 530 included in the third section 500. For example, In case the selection data SD is provided from the first data region 110, the second reference bit REF1 may be provided from the second reference region 330 included in the second section 300 and the first reference bit REF0 may be provided from the third reference region 530 included in the third section 500.

The unit array 10 of a memory device includes a first section 100, a second section 300 and a third section 500. In case the selection data SD is provided from the first section 100, the first reference bit REF0 and the second reference bit REF1 may be provided from the second section 300 and the third section 500. If column line numbers corresponding to each of the first section 100, the second section 300 and the third section 500 are equal, capacitances corresponding to each of the first section 100, the second section 300 and the third section 500 may be equal. The capacitance 110_C corresponding to the first section 100 may be parasitic capacitance included in the first section 100 and input-output lines that are connected to the first section 100. The capacitance 310_C corresponding to the second section 300 may be parasitic capacitance included in the second section 300 and input-output lines that are connected to the second section 300. The capacitance 510_C corresponding to the third section 500 may be parasitic capacitance included in the third section 500 and input-output lines that are connected to the third section 500. If deviation of capacitance corresponding to each of the first section 100, the second section 300 and the third section 500 is decreased, the speed of outputting the selection data SD, the first reference bit REF0 and the second reference bit REF1 based on the access address ADDR_A may be increased.

Figure 19:
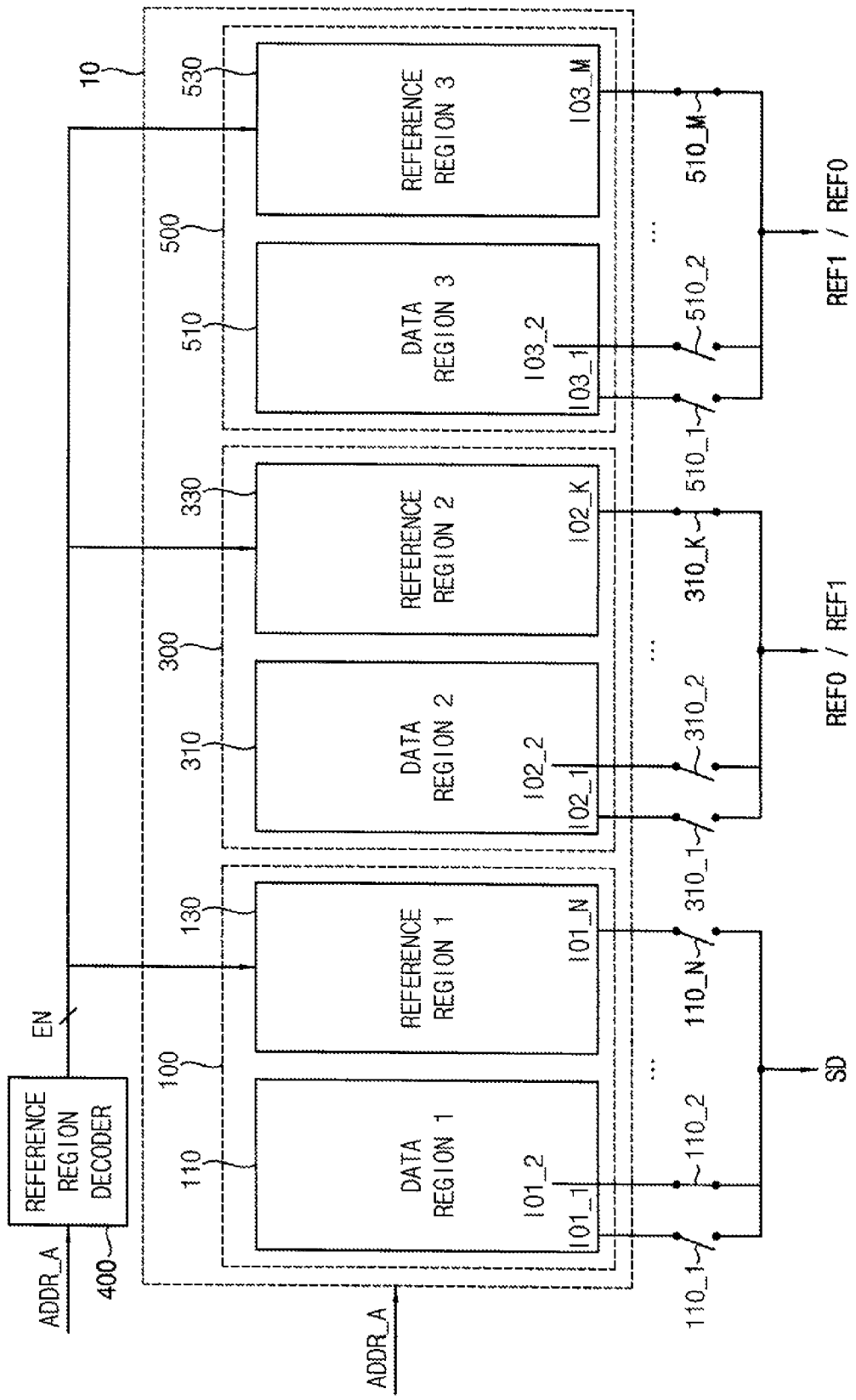
FIG. 19 is a block diagram illustrating a memory device according to an example embodiment.

FIG. 19 is a block diagram illustrating a memory device according to an example embodiment and FIG. 20 is a diagram for describing an operation of the memory device of FIG. 19.

Referring to FIGS. 19 and 20, the memory device may further comprise a reference region decoder 400 controlling the first reference region 130, the second reference region 330 and the third reference region 530 based on the access address ADDR_A.

In an example embodiment, in case a section corresponding to the access address ADDR_A is the first section 100, the first reference region 130 may be deactivated and the second reference region 330 and the third reference region 530 may be activated. In this case, the selection data SD may be provided from the first data region 110 included in the first section 100, the first reference bit REF0 may be provided from the second reference region 330 included in the second section 300 and the second reference bit REF1 may be provided from the third reference region 530 included in the third section 500. In another example, the selection data SD may be provided from the first data region 110 included in the first section 100, the second reference bit REF1 may be provided from the second reference region 330 included in the second section 300 and the first reference bit REF0 may be provided from the third reference region 530 included in the third section 500.

In an example embodiment, in case a section corresponding to the access address ADDR_A is the second section 300, the second reference region 330 may be deactivated and the first reference region 130 and the third reference region 530 may be activated. In this case, the selection data SD may be provided from the second data region 310 included in the second section 300, the first reference bit REF0 may be provided from the first reference region 130 included in the first section 100 and the second reference bit REF1 may be provided from the third reference region 530 included in the third section 500. In another example, the selection data SD may be provided from the second data region 310 included in the second section 300, the second reference bit REF1 may be provided from the first reference region 130 included in the first section 100 and the first reference bit REF0 may be provided from the third reference region 530 included in the third section 500.

In an example embodiment, in case a section corresponding to the access address ADDR_A is the third section 500, the third reference region 530 may be deactivated and the first reference region 130 and the second reference region 330 may be activated. In this case, the selection data SD may be provided from the third data region 510 included in the third section 500, the first reference bit REF0 may be provided from the second reference region 330 included in the second section 300 and the second reference bit REF1 may be provided from the first reference region 130 included in the first section 100. In another example, the selection data SD may be provided from the third data region 510 included in the third section 500, the second reference bit REF1 may be provided from the second reference region 330 included in the second section 300 and the first reference bit REF0 may be provided from the first reference region 130 included in the first section 100.

In the examples above, in certain embodiments, the reference regions are activated or deactivated based on switches (e.g., transistors that are either on or off). For example, each section 100, 300, and 500 may include a switch circuit that includes a plurality of switches. For example, section 100 may include a switch circuit including switches 110_1 to 110_N, positioned between the cell regions 110/130 and a first sense amplifier, section 300 may include a switch circuit including switches 310_1 to 310_N, positioned between the cell regions 310/330 and a sense amplifier, and section 500 may include a switch circuit including switches 510_1 to 510_N, positioned between the cell regions 510/530 and a sense amplifier. In one embodiment, to deactivate (e.g., disable, or not enable) a reference region, the corresponding set of switches (e.g., one or two switches) connected to that reference region is left open. To activate (e.g., enable) a reference region, the corresponding set of switches (e.g., one or two switches) connected to that reference region is closed.

As such, according to certain embodiments, a memory device includes a memory array including a plurality of sections, each including a plurality of memory cells and at least one reference cell. The memory device may also include a plurality of sense amplifier circuits respectively corresponding to the plurality of sections, and a plurality of switch circuits. Each switch circuit may be connected between a respective section and sense amplifier circuit. Each switch circuit may be configured to select between communicatively connecting a first column of memory cells or a reference cell to a corresponding sense amplifier.

The memory array may include, for example, $2^n$ memory cells, n being an integer greater than 1. In certain embodiments, the plurality of sections include at least a first memory cell region including a first set of columns of memory cells, a first reference cell region including at least a first reference cell, a second memory cell region including a second set of columns of memory cells, a second reference cell region including at least a second reference cell, a third memory cell region including a third set of columns of memory cells, and a third reference cell region including at least a third reference cell. Each column may be connected to a respective bit line. In certain embodiments, the first memory cell region and first reference cell region are part of a first memory array section of the plurality of sections, the second memory cell region and second reference cell region are part of a second memory array section of the plurality of sections, and the third memory cell region and third reference cell region are part of a third memory array section of the plurality of sections.

As discussed in connection with the various figures above, the first set of columns of memory cells and the first reference cell may be connected to a first respective sense amplifier through a first line, the second set of columns of memory cells and the second reference cell may be connected to a second respective sense amplifier through a second line, and the third set of columns of memory cells and the third reference cell may be connected to a third respective sense amplifier through a third line.

As also described above, the plurality of sections may include at least first through third sections, and the memory array may be configured such that a reference cell from the first section is used with a reference cell from the second section to read data stored in a memory cell of the third section. At the same time, the memory device may be configured such that a reference cell from the second section is used with a reference cell from the third section to read data stored in a memory cell of the first section.

In certain embodiments, at least one of the first reference cell, the second reference cell, and the third reference cell stores a logic 1, and at least another of the first reference cell, the second reference cell, and the third reference cell stores a logic 0.

In certain embodiments, each switch circuit of a memory device is configured to select between communicatively connecting a first column of memory cells or a reference cell to a corresponding sense amplifier based on an access address corresponding to a column of memory cells.

In the example described above, the plurality of switch circuits may be configured to, in response to an access address, perform certain steps. These steps may include, for example, accessing a first memory cell region of a first section of the plurality of sections and deactivate a first reference cell region of the first section, activating a second reference cell region of a second section of the plurality of memory array sections, and activating a third reference cell region of a third section of the plurality of memory array sections. A sense amplifier corresponding to the first memory cell region may be configured to output read data based on the accessed first memory cell region, a reference cell in the activated second reference cell region, and a reference cell in the activated third reference cell region.

FIG. 21 is a diagram illustrating an enable signal outputted from a reference region decoder in a case where a data column line number is 32, according to one exemplary embodiment.

Referring to FIG. 21, the data column line number may be 32. The column lines included in the first data region 110 of the first section 100 may be data column line 1 to data column line 10. The column lines included in the second data region 310 of the second section 300 may be data column line 11 to data column line 21. The column lines included in the third data region 510 of the third section 500 may be data column line 22 to data column line 32. For example, in case the access address ADDR_A is an address corresponding to one of the data column line 1 to data column line 10, the first reference region 130 may be deactivated and the second reference region 330 and the third reference region 530 may be activated. In addition, in case the access address ADDR_A is an address corresponding to one of the data column line 11 to data column line 21, the second reference region 330 may be deactivated and the first reference region 130 and the third reference region 530 may be activated. In addition, in case the access address ADDR_A is an address corresponding to one of the data column line 22 to data column line 32, the third reference region 530 may be deactivated and the first reference region 130 and the second reference region 330 may be activated.

FIG. 22 is a diagram illustrating an enable signal outputted from a reference region decoder in case data column line number is 64, according to one exemplary embodiment.

Referring to FIG. 22, the data column line number may be 64. The column lines included in the first data region 110 of the first section 100 may be data column line 1 to data column line 21. The column lines included in the second data region 310 of the second section 300 may be data column line 22 to data column line 42. The column lines included in the third data region 510 of the third section 500 may be data column line 43 to data column line 64. For example, in case the access address ADDR_A is an address corresponding to one of the data column line 1 to data column line 21, the first reference region 130 may be deactivated and the second reference region 330 and the third reference region 530 may be activated. In addition, in case the access address ADDR_A is an address corresponding to one of the data column line 22 to data column line 42, the second reference region 330 may be deactivated and the first reference region 130 and the third reference region 530 may be activated. In addition, in case the access address ADDR_A is an address corresponding to one of the data column line 43 to data column line 64, the third reference region 530 may be deactivated and the first reference region 130 and the second reference region 330 may be activated.

FIG. 23 is a diagram illustrating an enable signal outputted from a reference region decoder in case data column line number is 128, according to one exemplary embodiment.

Referring to FIG. 23, the data column line number may be 128. The column lines included in the first data region 110 of the first section 100 may be data column line 1 to data column line 42. The column lines included in the second data region 310 of the second section 300 may be data column line 43 to data column line 85. The column lines included in the third data region 510 of the third section 500 may be data column line 86 to data column line 128. For example, in case the access address ADDR_A is an address corresponding to one of the data column line 1 to data column line 42, the first reference region 130 may be deactivated and the second reference region 330 and the third reference region 530 may be activated. In addition, in case the access address ADDR_A is an address corresponding to one of the data column line 43 to data column line 85, the second reference region 330 may be deactivated and the first reference region 130 and the third reference region 530 may be activated. In addition, in case the access address ADDR_A is an address corresponding to one of the data column line 86 to data column line 128, the third reference region 530 may be deactivated and the first reference region 130 and the second reference region 330 may be activated.

Figure 24:
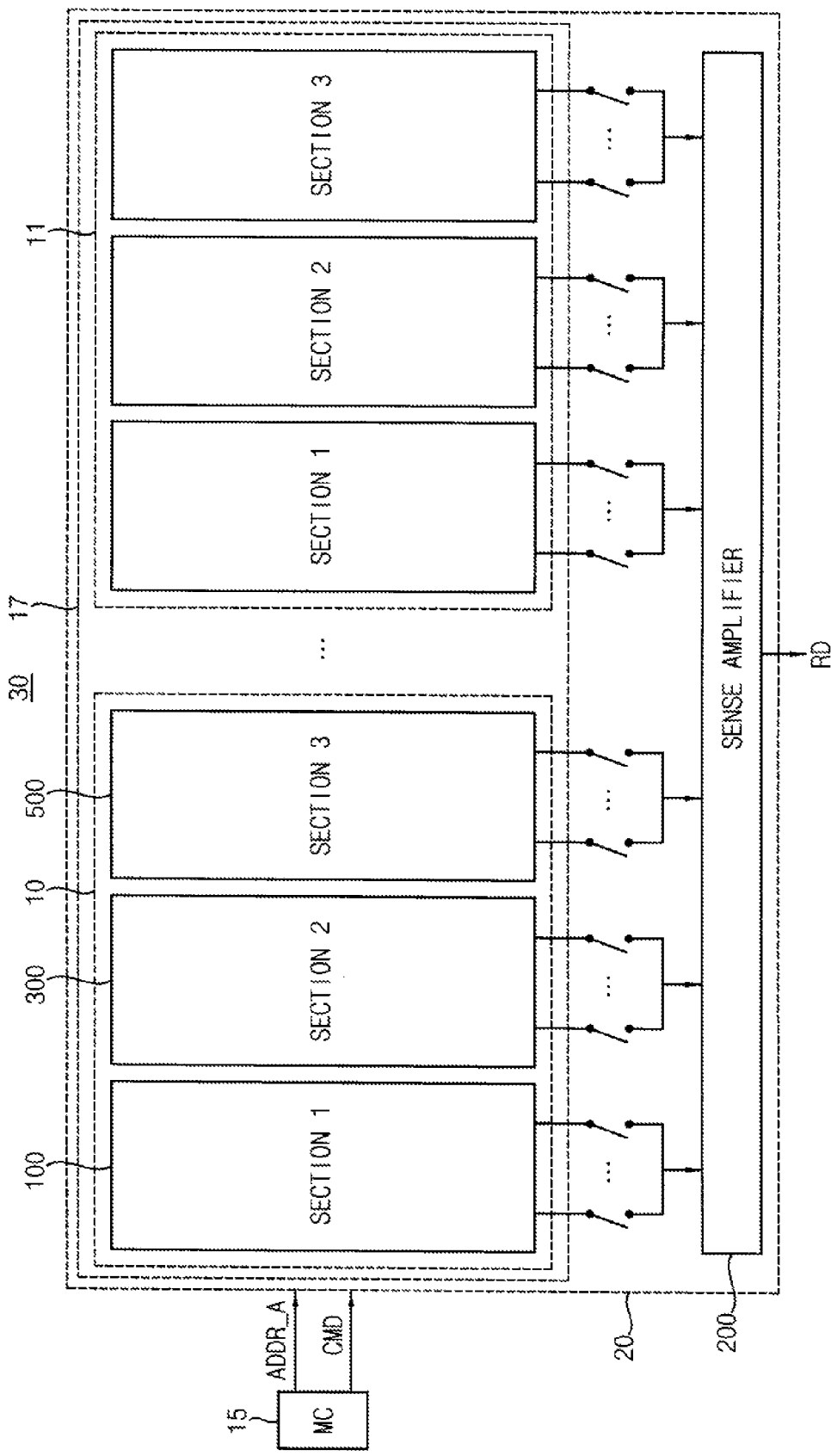
FIG. 24 is a block diagram illustrating a memory system according to example embodiments.

FIG. 24 is a block diagram illustrating a memory system according to example embodiments.

Referring to FIG. 24, a memory system 30 includes a memory controller 15, a memory cell array 17 and a sense amplifier 200. As described in connection with the various figures herein, the term "sense amplifier" may refer to a single sense amplifier circuit used to sense data received from a single line, and may also refer to an array or group of these sense amplifiers. A sense amplifier circuit may also refer to a single sense amplifier or a group of sense amplifiers. The memory controller 15 provides an access address ADDR_A and a command. The memory cell array 17 includes unit arrays 10. The unit array 10 includes a first section 100, a second section 300 and a third section 500. The unit array 10 provides a selection data SD, a first reference bit REF0, and a second reference bit REF1 based on the access address ADDR_A and the command. The sense amplifier provides read data based on the selection data SD, the first reference bit REF0, and the second reference bit REF1. The first section 100 includes a first data region 110 and a first reference region 130. The first reference region 130 stores at least one of the first reference bit REF0 and the second reference bit REF1. The second section 300 includes a second data region 310 and a second reference region 330. The second reference region 330 stores at least one of the first reference bit REF0 and the second reference bit REF1. The third section 500 includes a third data region 510 and a third reference region 530. The third reference region 530 stores at least one of the first reference bit REF0 and the second reference bit REF1. The first section 100, the second section 300 and the third section 500 output a selection data SD corresponding to an access address ADDR_A, the first reference bit REF0 and the second reference bit REF1 based on the access address ADDR_A.

For example, data region corresponding to the access address ADDR_A may be the first data region 110 included in the first section 100. In case the selection data SD is provided from the first data region 110, the first reference bit REF0 may be provided from the second reference region 330 included in the second section 300 and the second reference bit REF1 may be provided from the third reference region 530 included in the third section 500. For example, In case the selection data SD is provided from the first data region 110, the second reference bit REF1 may be provided from the second reference region 330 included in the second section 300 and the first reference bit REF0 may be provided from the third reference region 530 included in the third section 500.

The unit array 10 of a memory device includes a first section 100, a second section 300 and a third section 500. In case the selection data SD is provided from the first section 100, the first reference bit REF0 and the second reference bit REF1 may be provided from the second section 300 and the third section 500. If column line numbers corresponding to each of the first section 100, the second section 300 and the third section 500 are equal, capacitances corresponding to each of the first section 100, the second section 300 and the third section 500 may be equal. The capacitance 110_C corresponding to the first section 100 may be parasitic capacitance included in the first section 100 and input-output lines that are connected to the first section 100. The capacitance 310_C corresponding to the second section 300 may be parasitic capacitance included in the second section 300 and input-output lines that are connected to the second section 300. The capacitance 510_C corresponding to the third section 500 may be parasitic capacitance included in the third section 500 and input-output lines that are connected to the third section 500. If deviation of capacitance corresponding to each of the first section 100, the second section 300 and the third section 500 is decreased, the speed of outputting the selection data SD, the first reference bit REF0 and the second reference bit REF1 based on the access address ADDR_A may be increased.

The memory system of FIG. 24 may comprise, for example, an electronic device such as a semiconductor package including one or more memory chips and a controller chip. The memory system may also comprise a memory module.

Figure 25:
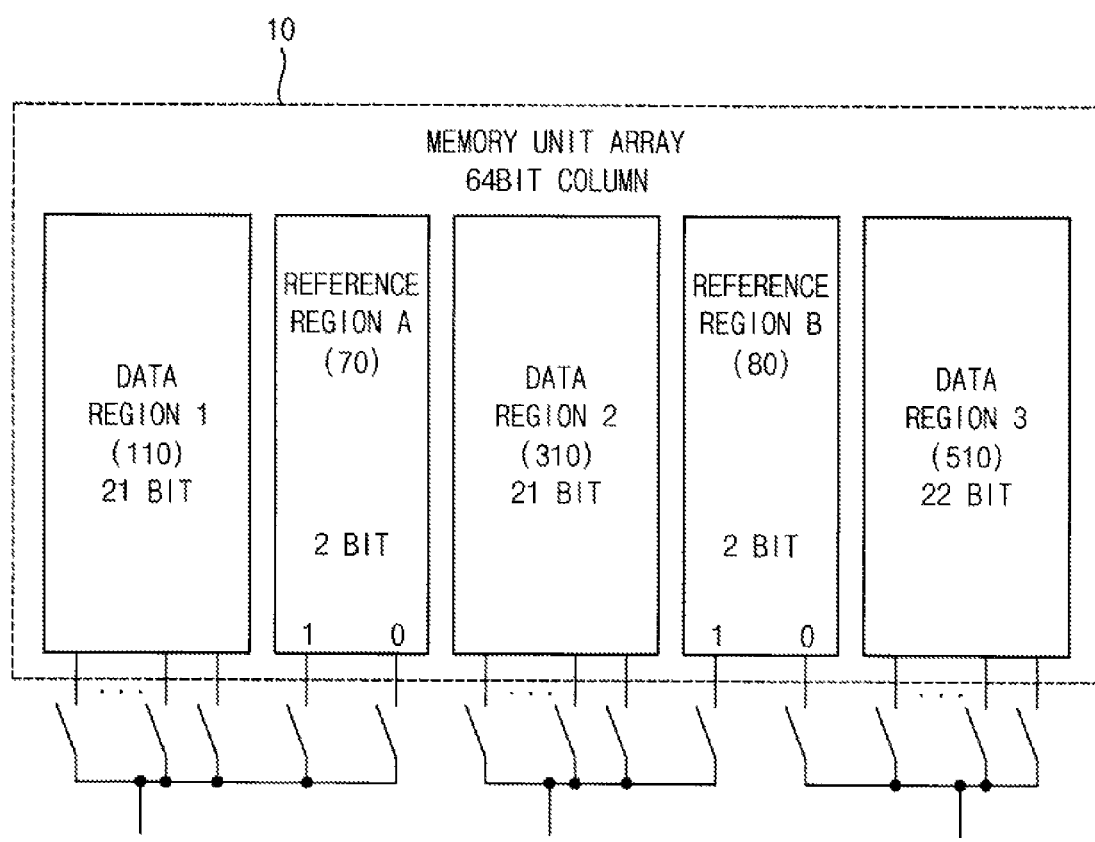
FIG. 25 is a diagram illustrating a unit array of a memory device according to an example embodiment.

FIG. 25 is a diagram illustrating a unit array of a memory device according to an example embodiment.

Referring to FIG. 25, a unit array 10 includes a first data region 110, a second data region 310, a third data region 510, a reference region A 70 and a reference region B 80. The reference region A 70 may be in a first side of the second data region 310. The reference region B 80 may be in a second side of the second data region 310. The first side of the second data region 310 may be a left side of the second data region 310 and the second side of the second data region 310 may be a right side of the second data region 310. The reference region A 70 and the reference region B 80 may be symmetrically placed based on the second data region 310.

Figure 26:
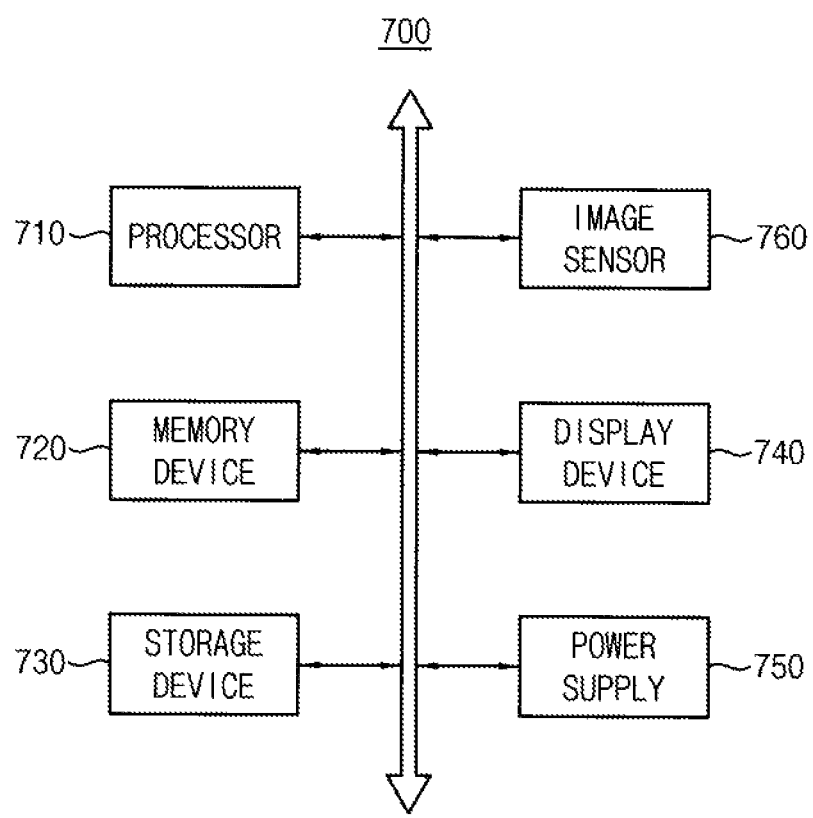
FIG. 26 is a block diagram illustrating a mobile device including the memory device according to example embodiments.

FIG. 26 is a block diagram illustrating a mobile device including the memory device according to example embodiments.

Referring to FIG. 26, a mobile device 700 may be an electronic device that includes a processor 710, a memory device 720, a storage device 730, a display device 740, a power supply 750 and an image sensor 760. The mobile device 700 may further include ports that communicate with a video card, a sound card, a memory card, a USB device, other electronic devices, etc.

The processor 710 may perform various calculations or tasks. According to embodiments, the processor 710 may be a microprocessor or a CPU. The processor 710 may communicate with the memory device 720, the storage device 730, and the display device 740 via an address bus, a control bus, and/or a data bus. In some embodiments, the processor 710 may be coupled to an extended bus, such as a peripheral component interconnection (PCI) bus. The memory device 720 may store data for operating the mobile device 700. For example, the memory device 720 may be implemented with a dynamic random access memory (DRAM) device, a mobile DRAM device, a static random access memory (SRAM) device, a phase-change random access memory (PRAM) device, a ferroelectric random access memory (FRAM) device, a resistive random access memory (RRAM) device, and/or a magnetic random access memory (MRAM) device. The memory device 720 includes the data loading circuit according to example embodiments. The storage device 730 may include a solid state drive (SSD), a hard disk drive (HDD), a CD-ROM, etc. The mobile device 700 may further include an input device such as a touchscreen, a keyboard, a keypad, a mouse, etc., and an output device such as a printer, a display device, etc. The power supply 750 supplies operation voltages for the mobile device 700.

The image sensor 760 may communicate with the processor 710 via the buses or other communication links. The image sensor 760 may be integrated with the processor 710 in one chip, or the image sensor 760 and the processor 710 may be implemented as separate chips.

At least a portion of the mobile device 700 may be packaged in various forms, such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline IC (SOIC), shrink small outline package (SSOP), thin small outline package (TSOP), system in package (SIP), multi chip package (MCP), wafer-level fabricated package (WFP), or wafer-level processed stack package (WSP). The mobile device 700 may be a digital camera, a mobile phone, a smart phone, a portable multimedia player (PMP), a personal digital assistant (PDA), a computer, etc.

Figure 27:
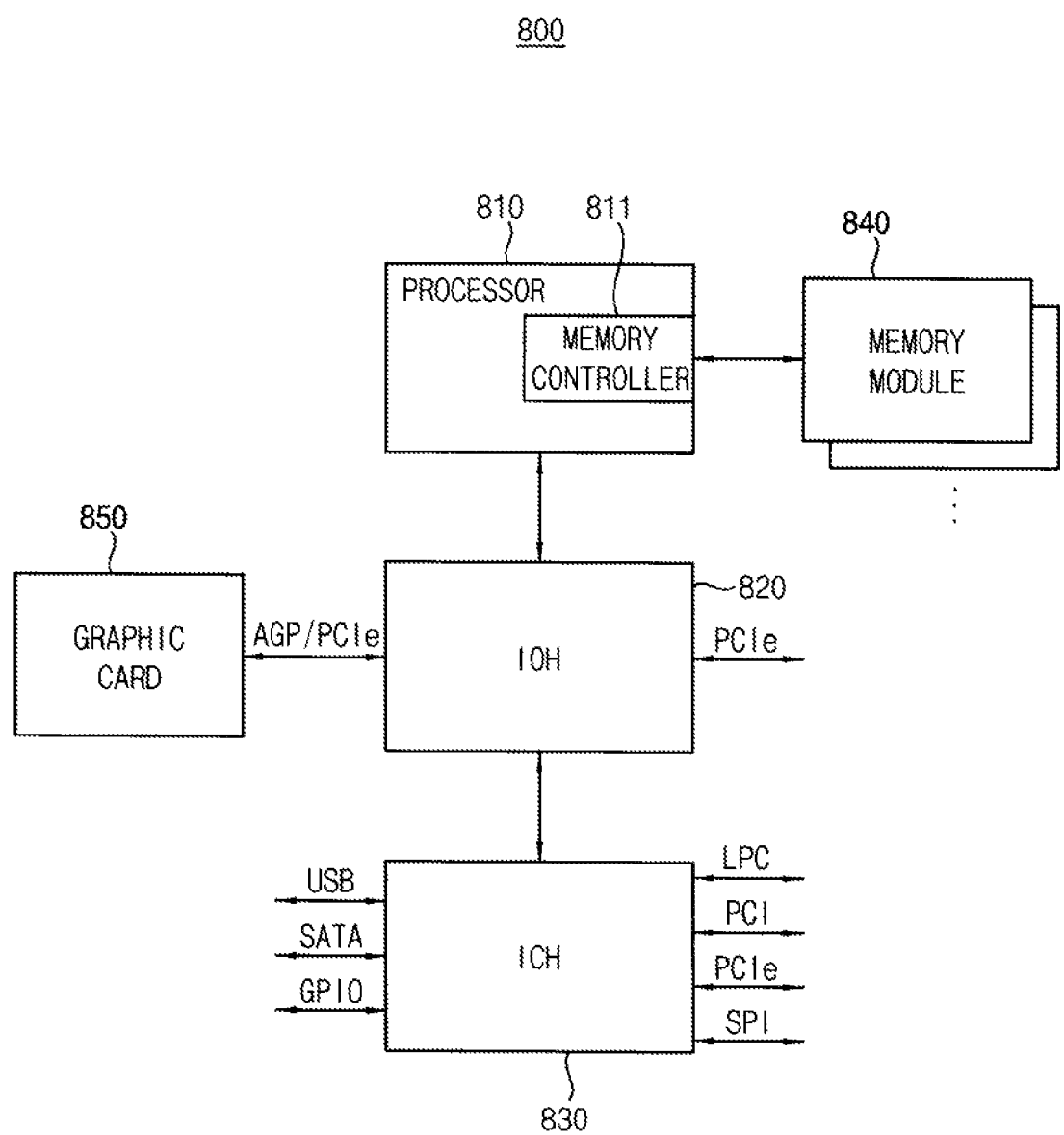
FIG. 27 is a block diagram illustrating a computing system including the memory device according to example embodiments.

FIG. 27 is a block diagram illustrating a computing system including the memory device according to example embodiments.

Referring to FIG. 27, a computing system 800 includes a processor 810, an input/output hub (IOH) 820, an input/output controller hub (ICH) 830, at least one memory module 840 and a graphics card 850. In some embodiments, the computing system 800 may be an electronic device such as a personal computer (PC), a server computer, a workstation, a laptop computer, a mobile phone, a smart phone, a personal digital assistant (PDA), a portable multimedia player (PMP), a digital camera), a digital television, a set-top box, a music player, a portable game console, a navigation system, etc.

The processor 810 may perform various computing functions, such as executing specific software for performing specific calculations or tasks. For example, the processor 810 may be a microprocessor, a central process unit (CPU), a digital signal processor, or the like. In some embodiments, the processor 810 may include a single core or multiple cores. For example, the processor 810 may be a multi-core processor, such as a dual-core processor, a quad-core processor, a hexa-core processor, etc. In some embodiments, the computing system 800 may include a plurality of processors. The processor 810 may include an internal or external cache memory.

The processor 810 may include a memory controller 811 for controlling operations of the memory module 840. The memory controller 811 included in the processor 810 may be referred to as an integrated memory controller (IMC). A memory interface between the memory controller 811 and the memory module 840 may be implemented with a single channel including a plurality of signal lines, or may bay be implemented with multiple channels, to each of which at least one memory module 840 may be coupled. In some embodiments, the memory controller 811 may be located inside the input/output hub 820, which may be referred to as memory controller hub (MCH).

The input/output hub 820 may manage data transfer between processor 810 and devices, such as the graphics card 850. The input/output hub 820 may be coupled to the processor 810 via various interfaces. For example, the interface between the processor 810 and the input/output hub 820 may be a front side bus (FSB), a system bus, a HyperTransport, a lightning data transport (LDT), a QuickPath interconnect (QPI), a common system interface (CSI), etc. In some embodiments, the computing system 800 may include a plurality of input/output hubs. The input/output hub 820 may provide various interfaces with the devices. For example, the input/output hub 820 may provide an accelerated graphics port (AGP) interface, a peripheral component interface-express (PCIe), a communications streaming architecture (CSA) interface, etc.

The graphics card 850 may be coupled to the input/output hub 820 via AGP or PCIe. The graphics card 850 may control a display device (not shown) for displaying an image. The graphics card 850 may include an internal processor for processing image data and an internal memory device. In some embodiments, the input/output hub 820 may include an internal graphics device along with or instead of the graphics card 850 outside the graphics card 850. The graphics device included in the input/output hub 820 may be referred to as integrated graphics. Further, the input/output hub 820 including the internal memory controller and the internal graphics device may be referred to as a graphics and memory controller hub (GMCH).

The input/output controller hub 830 may perform data buffering and interface arbitration to efficiently operate various system interfaces. The input/output controller hub 830 may be coupled to the input/output hub 820 via an internal bus, such as a direct media interface (DMI), a hub interface, an enterprise Southbridge interface (ESI), PCIe, etc. The input/output controller hub 830 may provide various interfaces with peripheral devices. For example, the input/output controller hub 830 may provide a universal serial bus (USB) port, a serial advanced technology attachment (SATA) port, a general purpose input/output (GPIO), a low pin count (LPC) bus, a serial peripheral interface (SPI), PCI, PCIe, etc.

In some embodiments, the processor 810, the input/output hub 820 and the input/output controller hub 830 may be implemented as separate chipsets or separate integrated circuits. In other embodiments, at least two of the processor 810, the input/output hub 820 and the input/output controller hub 830 may be implemented as a single chipset.

Some example embodiments described above provide a memory system, a memory device, and a unit array of a memory device capable of increasing an operation speed by decreasing deviation of capacitance corresponding to each of a first section, a second section and a third section that provide a selection data, a first reference bit and a second reference bit.

Various aspects of the present inventive concept may be applied to systems such as a mobile phone, a smart phone, a personal digital assistant (PDA), a portable multimedia player (PMP), a digital camera, a music player, a portable game console, a navigation system, etc. The foregoing is illustrative of exemplary embodiments and is not to be construed as limiting thereof. Although a few exemplary embodiments have been described, those skilled in the art will readily appreciate that many modifications are possible in the exemplary embodiments without materially departing from the novel teachings and advantages of the present inventive concept. Accordingly, all such modifications are intended to be included within the scope of the present inventive concept as defined in the claims.

What is claimed is:

1. A memory device, comprising:
    a unit array of memory cells, the unit array including $2^n$ columns of memory cells and a plurality of reference cells, n being an integer greater than 1;
    a first memory cell region of the unit array including a first set of columns of memory cells, each column connected to a respective bit line;
    a first reference cell region of the unit array including at least a first reference cell;
    a first line selectively connected through a plurality of first switches to the first set of columns of memory cells and to the first reference cell;
    a second memory cell region of the unit array including a second set of columns of memory cells, each column connected to a respective bit line;
    a second reference cell region of the unit array including at least a second reference cell;
    a second line selectively connected through a plurality of second switches to the second set of columns of memory cells and to the second reference cell;
    a third memory cell region of the unit array including a third set of columns of memory cells, each column connected to a respective bit line;

a third reference cell region of the unit array including at least a third reference cell;
a third line selectively connected through a plurality of third switches to the third set of columns of memory cells and to the third reference cell; and
a sense amplifier electrically connected to the first line, the second line, and the third line,
wherein the sense amplifier is configured to provide read data based on a concurrent output from the first line, the second line, and the third line.

2. The memory device of claim 1, wherein:
the sense amplifier is configured to provide read data based on an output on the first line from a column from the first set of columns of memory cells, an output on the second line from the second reference cell, and an output on the third line from the third reference cell.

3. The memory device of claim 2, wherein:
the sense amplifier is further configured to provide read data based on an output on the second line from a column from the second set of columns of memory cells, an output on the first line from the first reference cell, and an output on the third line from the third reference cell.

4. The memory device of claim 1, further comprising:
a fourth reference cell in the first reference cell region, the fourth reference cell selectively connected to the first line.

5. The memory device of claim 1, wherein the memory cells of the unit array of memory cells are magnetic random access memory (MRAM) cells.

6. The memory device of claim 1, wherein:
the first reference cell region is positioned between the first memory cell region and the second memory cell region; and
the second reference cell region is positioned between the second memory cell region and the third memory cell region.

7. The memory device of claim 1, wherein the number of columns in the first set of columns is the same as the number of columns in the second set of columns and is different from the number of columns in the third set of columns.

8. The memory device of claim 1, wherein the unit array of memory cells is configured to provide selected data corresponding to an access address associated with one of the columns of memory cells of the first, second, or third columns of memory cells.

9. The memory device of claim 1, wherein:
the memory device is configured such that when each of the first, second, or third line outputs selected data, one of the remaining two lines outputs a first reference bit, and the other of the remaining two lines outputs a second reference bit different from the first reference bit.

10. A memory device comprising:
a memory array;
a plurality of sections of the memory array, each including a plurality of memory cells and at least one reference cell;
a plurality of sense amplifier circuits respectively corresponding to the plurality of sections; and
a plurality of switch circuits, each switch circuit connected between a respective section and sense amplifier circuit,
wherein each switch circuit is configured to select between communicatively connecting a first column of memory cells or a reference cell to a corresponding sense amplifier, such that each switch circuit switches between connecting a first column of memory cells to a corresponding sense amplifier and connecting a reference cell to the corresponding sense amplifier;
wherein:
the memory array includes $2^n$ memory cells, n being an integer greater than 1;
the plurality of sections include at least:
a first memory cell region including a first set of columns of memory cells, each column connected to a respective bit line;
a first reference cell region including at least a first reference cell;
a second memory cell region including a second set of columns of memory cells, each column connected to a respective bit line;
a second reference cell region including at least a second reference cell;
a third memory cell region including a third set of columns of memory cells, each column connected to a respective bit line; and
a third reference cell region including at least a third reference cell, wherein:
the first memory cell region and first reference cell region are part of a first memory array section of the plurality of sections;
the second memory cell region and second reference cell region are part of a second memory array section of the plurality of sections; and
the third memory cell region and third reference cell region are part of a third memory array section of the plurality of sections; and
wherein:
the first set of columns of memory cells and the first reference cell are connected to a first respective sense amplifier through a first line;
the second set of columns of memory cells and the second reference cell are connected to a second respective sense amplifier through a second line; and
the third set of columns of memory cells and the third reference cell are connected to a third respective sense amplifier through a third line.

11. The memory device of claim 10, wherein:
the memory device is configured such that a reference cell from the first memory array section is used with a reference cell from the second memory array section to read data stored in a memory cell of the third memory array section.

12. The memory device of claim 11, wherein:
the memory device is configured such that a reference cell from the second memory array section is used with a reference cell from the third memory array section to read data stored in a memory cell of the first memory array section.

13. The memory device of claim 10, wherein:
the first reference cell region is positioned between the first memory cell region and the second memory cell region; and
the second reference cell region is positioned between the second memory cell region and the third memory cell region.

14. The memory device of claim 10, wherein:
each switch circuit is configured to select between communicatively connecting a first column of memory cells or a reference cell to a corresponding sense amplifier based on an access address corresponding to a column of memory cells.

15. The memory device of claim 10, wherein:

the plurality of switch circuits are configured to, in response to an access address:

access the first memory cell region of the first memory array section of the plurality of sections and deactivate a first reference cell region of the first memory array section;

activate the second reference cell region of the second memory array section of the plurality of memory array sections; and activate the third reference cell region of the third memory array section of the plurality of memory array sections.

16. The memory device of claim 15, wherein a sense amplifier corresponding to the first memory cell region is configured to output read data based on the accessed first memory cell region, a reference cell in the activated second reference cell region, and a reference cell in the activated third reference cell region.

17. A memory device comprising:

a memory cell array including unit arrays each configured to provide selected data corresponding to an access address, and configured to use a first reference cell storing a first reference bit having a first logic value and a second reference cell storing a second reference bit having a second logic value different from the first logic value, the first reference cell and second reference cell selected based on the access address; and a sense amplifier configured to provide read data based on the selected data, the first reference bit, and the second reference bit, a first unit array of the unit arrays comprising:

a first section including a first data region and a first reference region, the first reference region including the first reference cell storing the first reference bit;

a second section including a second data region and a second reference region, the second reference region including the second reference cell storing the second reference bit; and a third section including a third data region and a third reference region, the third reference region including a third reference cell storing a third reference bit having one of the first or second logic value, wherein each of the first section, the second section, and the third section are configured to output selected data when the access address corresponds to that section; and wherein the memory device is configured such that when each of the first, second, or third section outputs selected data, one of the remaining two sections outputs a first reference bit, and the other of the remaining two sections outputs a second reference bit different from the first reference bit.

18. The memory device of claim 17, wherein the memory device further comprises a reference region decoder controlling the first reference region, the second reference region, and the third reference region, based on the access address.

19. The memory device of claim 18, additionally configured such that, when a section corresponding to the access address is the first section, the first reference region is deactivated and the second reference region and the third reference region are activated.

\* \* \* \* \*